US005410606A

United States Patent [19]

Imai et al.

[11] Patent Number: 5,410,606

[45] Date of Patent: Apr. 25, 1995

[54] NOISE CANCELING METHOD

[75] Inventors: Kenji Imai; Tetsu Kanamori; Syunichi Imanishi; Hideki Sato; Makoto Namekawa; Masaichi Akiho, all of Iwaki; Tsuyoshi Yamashita, Wako; Kunio Miyauchi, Wako; Hisashi Sano, Wako; Akira Suto, Wako, all of Japan

[73] Assignee: Honda Giken Kogyo Kabushiki Kaisha, Tokyo, Japan

[21] Appl. No.: 90,277

[22] Filed: Jul. 13, 1993

[30] Foreign Application Priority Data

| | | | |
|---|---|---|---|
| Jul. 21, 1992 | [JP] | Japan | 4-194274 |
| Aug. 7, 1992 | [JP] | Japan | 4-211347 |
| Oct. 29, 1992 | [JP] | Japan | 4-291258 |
| Dec. 25, 1992 | [JP] | Japan | 4-346224 |

[51] Int. Cl.[6] ..... H03B 29/00

[52] U.S. Cl. ..... 381/71; 381/94

[58] Field of Search ..... 381/71, 94

[56] References Cited

U.S. PATENT DOCUMENTS 5,222,148 6/1993 Yuan ..... 381/71

OTHER PUBLICATIONS

Dorf, Richard C., *Modern Control Systems* (Jan. 1992) p. 66.

*Primary Examiner*—Curtis Kuntz
*Assistant Examiner*—Mark D. Kelly
*Attorney, Agent, or Firm*—Staas & Halsey

[57] ABSTRACT

A noise-canceling method for simultaneously canceling a plurality of harmonic components of the engine rotational speed contained in engine noise. Reference signals are generated in correspondence with a plurality of harmonic components, and an adaptive signal processing is executed by using each reference signal, a composite-sound signal of the engine sound and a composite noise-canceling sound at a noise-canceling point, thereby generating a noise-canceling signal. The noise-canceling signal is input to a speaker. The reference signal corresponding to a harmonic component of a low level is multiplied by a constant K before it is input to the speaker so as to approximately equalize the levels of all the harmonic components at the noise-canceling point.

6 Claims, 23 Drawing Sheets

FIG. 8

| Engine rotational speed range | Gain $g_2$ | Gain $g_4$ | Gain $g_6$ |
|---|---|---|---|
| RPS1 | $g_{21}$ | $g_{41}$ | $g_{61}$ |
| RPS2 | $g_{22}$ | $g_{42}$ | $g_{62}$ |
| RPS3 | $g_{23}$ | $g_{43}$ | $g_{63}$ |
| RPS4 | $g_{24}$ | $g_{44}$ | $g_{64}$ |
| RPS5 | $g_{25}$ | $g_{45}$ | $g_{65}$ |
| RPS6 | $g_{26}$ | $g_{46}$ | $g_{66}$ |
| RPS7 | $g_{27}$ | $g_{47}$ | $g_{67}$ |
| RPS8 | $g_{28}$ | $g_{48}$ | $g_{68}$ |

| Engine rotational speed | Order of harmonics |
|---|---|
| 0 ~ $r_0$ | Second + Fourth |
| $r_0$ ~ $r_1$ | Second + Sixth |
| $r_1$ ~ $r_2$ | Second + Fourth |
| $r_2$ ~ $r_3$ | Second + Sixth |
| $r_3$ ~ | Second + Fourth |

NOISE CANCELING METHOD

BACKGROUND OF THE INVENTION

FIELD OF THE INVENTION

The present invention relates to a noise-canceling method for canceling the engine noise at a predetermined position (observation point) in an automotive vehicle and, more particularly, to a noise-canceling method for canceling harmonic components of a level higher than 2 among harmonic components of an engine rotational speed, which are contained in the engine noise, so as to provide a comfortable environment in the passenger compartment of the automotive vehicle.

A known method of dealing with noise involves using a sound-absorbing material (this is a method of passive control). With a method that relies upon use of a sound-absorbing material, however, forming a silent area of little noise is troublesome and low-pitched sounds are not eliminated effectively. In particular, when noise within the passenger compartment of an automotive vehicle is prevented by passive control, the vehicle increases in weight and the noise cannot be eliminated effectively.

For this reason, active-control methods in which a noise-canceling sound, whose phase is the opposite of the noise, is emitted from a speaker so as to reduce the noise have become the focus of attention. Additionally, these methods are being put into practical use in factory and office interiors. Systems for reducing noise by active control have been proposed for the passenger compartments of automotive vehicles as well.

FIG. 12 is a block diagram of an apparatus for achieving the cancellation of sound. As shown in FIG. 12, an engine 11 which is a source of noise has its rotational speed R sensed by an rotational speed sensor 12. The output R of the sensor 12 is applied to a reference signal generator 13, which generates a sinusoidal signal having a fixed amplitude and a frequency that conforms to the rotational speed R of the engine 11. The sinusoidal signal serves as a reference signal $x_n$. When an engine is a source of noise, the noise generated by rotation of the engine has periodicity (is periodic noise) and the frequency of the noise is dependent upon the engine rotational speed. In the case of a four-cylinder engine, for example, the frequency of periodic noise generated within the passenger compartment is 20 Hz when the rotational speed is 600 rpm (=10 rps) and 200 Hz when the rotational speed is 6000 rpm (=100 rps). These are second harmonics of the engine speed. Accordingly, the reference signal generator 13 stores the sinusoidal data in a ROM and generates the reference signal $x_n$ by reading out and delivering this data as necessary. The timing at which this data is read out and delivered is controlled in accordance with the engine rotational speed R so that the reference signal output will have a frequency conforming to the engine rotational speed R.

The reference signal $x_n$ generated by the reference-signal generator 13 is applied to a noise-canceling controller 14 as an input. Also fed into the controller 14 is an error signal $e_n$, which is a composite-sound signal that is a synthesis of noise $S_n$ and a noise-canceling sound $S_c$ at a noise-canceling position (an observation point, such as a point in the vicinity of the ears of the driver) within the passenger compartment. The noise-canceling controller 14 outputs a noise-canceling signal $N_c$ by executing an adaptive signal processing so as to minimize the error signal $e_n$. The controller 14 includes an adaptive signal processor 14*a*; an adaptive filter 14*b* constructed as a digital filter; a DA converter 14*c* for converting the output of the adaptive filter 14*b* (noise-canceling signal $N_c$) into an analog noise-canceling signal; and a filtered-X signal producing filter 14*d* for producing a filtered-X signal (reference signal for a signal processing) $r_n$ by superimposing, on the reference signal $x_n$, the propagation characteristic (transfer function) of a secondary-sound propagation system extending from a speaker to the noise-canceling point. The reference numeral 15 denotes a power amplifier for amplifying the noise-canceling signal, numeral 16 a canceling speaker for emitting the noise-canceling sound $S_c$; numeral 17, an error microphone which is disposed at the noise-canceling point so as to detect the composite sound of the noise $S_n$ and the noise-canceling sound $S_c$, and output a composite-sound signal as the error signal $e_n$; numeral 18, a secondary-sound propagation system (noise-canceling sound propagation system); numeral 19, an amplifier for amplifying the error signal $e_n$; numeral 20, a low-pass filter for eliminating noise signals outside the band of periodic noise; and numeral 20', an AD (Analog to Digital) converter for converting the output of the low-pass filter 20 into a digital signal.

The error signal $e_n$ at the noise-canceling point and the filtered-X signal $r_n$, which is output from the filter 14*d*, enter the adaptive signal processor 14. The adaptive signal processor 14*a* decides the coefficients of the adaptive filter 14*b* by using these two signals to execute an adaptive signal processing in such a manner that the noise at the noise-canceling point is canceled out. For example, the adaptive signal processor 14*a* decides the coefficients of the adaptive filter 14*b* in accordance with a well-known filtered-X LMS (least mean square) algorithm so as to minimize the error signal $e_n$ that has entered from the error microphone 17. In accordance with the coefficients decided by the adaptive signal processor 14*a*, the adaptive filter 14*b* subjects the reference signal $x_n$ to a digital filtering processing so that the DA (Digital to Analog) converter 14*c* will deliver the canceling-sound signal N. It should be noted that the reference signal $x_n$ must be a signal having a high correlation with respect to the noise $S_c$ to be canceled; sounds having no correlation with the reference signal are not canceled out.

When the engine 11 rotates, its rotational speed R is detected by the rpm sensor 12, the reference signal generator 13 generates the reference signal $x_n$ [see (a) in FIG. 13], whose frequency conforms to the engine rotational speed R, and the reference signal $x_n$ enters the noise-canceling controller 14.

At this time the periodic engine sound (periodic noise) generated by the engine 11 reaches the noise-canceling point upon propagating through space having a noise propagation system (a primary-noise propagation system) that exhibits a predetermined transfer function. Accordingly, the noise (engine sound) $S_n$ at the noise-canceling point has a slightly lower level and a slight delay, as illustrated at (b) in FIG. 13.

Initially, the noise-canceling controller 14 produces the noise-canceling signal $N_c$ so as to have a phase opposite that of the reference signal $x_n$, as a result of which the canceling speaker 16 outputs the noise-canceling sound $S_c$ shown at (c) in FIG. 13, by way of example. However, since the level and phase of the noise $S_n$ are displaced somewhat from the level and phase of the noise-canceling sound $S_c$, the noise is not canceled out by the noise-canceling sound $S_c$ and, hence, the error signal $e_n$ is generated. The noise-canceling controller 14 determines the coefficients of the adaptive filter 14*b* by performing an adaptive signal processing in such a manner that the error signal $e_n$ is minimized. In an ideal case, the phase of the noise-canceling sound $S_c$ will be opposite that of the noise $S_n$ and the levels thereof will be in agreement, as shown at (d) in FIG. 13, so that the noise is canceled out.

In order to simplify the description, the foregoing example deals with one noise source, one source (the speaker) for generating the noise-canceling sound, and one noise-canceling point (the observation point). In actuality, however, there is more than one noise source and more than one point (observation point) at which noise is desired to be canceled. In this case, more than one speaker is necessary since noise at a plurality of points cannot be canceled with only one speaker. FIG. 14 is a block diagram of a conventional noise-canceling apparatus for a case in which there are K-number of noise sources, M-number of speakers and L-number of observation points.

The reference numeral 21 denotes a noise-canceling controller having a DSP (digital signal processor) structure (which corresponds to the noise-canceling controller 14 in FIG. 12) that operates so as to cancel out noise at each of a number of observation points. The reference numeral 22 denotes a primary-sound hypothetical propagation system (noise propagation system), which expresses systems along which noise is propagated from each noise source (not shown) to each observation point. The reference numeral 23 represents a secondary-sound propagation system (noise-canceling sound propagation system), which expresses systems along which the noise-canceling sound is propagated from each speaker to each observation point. The system 23 includes the characteristics of the speakers (not shown). The reference numeral 24 designates a signal synthesizer, which implements the function of a microphone at each observation point. The signal synthesizer 24 includes adders $24_1$–$24_1'$ corresponding to a microphone at a first observation point, adders $24_2$–$24_2$, corresponding to a microphone at a second observation point, . . ., and adders $24_L$–$24_L'$ corresponding to a microphone at an L-th observation point. Further, $d_{d1n}$–$d_{dLn}$ represent external noise that is not the object of cancellation at each of the observation points.

The noise-canceling controller 21 includes a multiple-input/multiple-output adaptive filter (hereinafter referred to simply as an adaptive filter) 21*a* for inputting noise-canceling signals $Y_{a1n}$–$Y_{aMn}$ to the speakers upon being provided with inputs of reference signals $x_{a1n}$–$x_{aKn}$ (output by a reference signal generator, not shown) conforming to the noise components generated by the noise sources; a filtered-X signal producing filter 21*b*, which is fabricated using the elements (propagation elements) of a transfer-function matrix of the secondary-sound propagation system 23, this filter being provided with inputs of the reference signals $x_{a1n}$–$x_{aKn}$ conforming to the noise generated by the noise sources; and an adaptive signal processor 21*c*, which is provided with inputs of error signals $e_{1n}$–$e_{Ln}$ prevailing at the observation points and filtered-X signals $r_{111n}$–$r_{LMKn}$ output by the filter 21*b*, for deciding the coefficients of the adaptive filter 21*a* by executing an adaptive signal processing using these input signals so as to cancel out the noise at each observation point.

FIG. 15 is a diagram for describing the primary-sound hypothetical propagation system 22. As shown in FIG. 15A, the noise generated by K-number of noise sources $NG_1$–$NG_K$ reaches microphones ($MIC_1$–$MIC_L$), which are provided at the respective observation points, upon propagating through the primary-sound propagation system 22 having a predetermined frequency and predetermined phase characteristics. Accordingly, if we let $H_{ji}$ represent the transfer characteristic of a propagation system in which noise from an i-th noise source $NG_i$ reaches a j-th microphone $MIC_j$, the primary-noise hypothetical propagation system 22 will be expressed as shown in FIG. 15B and the transfer-function matrix (H) thereof will be as follows:

$$(H) = \begin{pmatrix} H_{11} & H_{12} & H_{13} & \ldots & H_{1K} \\ H_{21} & H_{22} & H_{23} & \ldots & H_{2K} \\ & & \cdot & & \\ & & \cdot & & \\ & & \cdot & & \\ H_{L1} & H_{L2} & H_{L3} & \ldots & H_{LK} \end{pmatrix}$$

Each element $H_{ij}$ of the transfer-function matrix (H) is implemented by a FIR-type digital filter shown in FIG. 16. More specifically, each element is realized by a digital filter comprising delay elements DL for successively delaying the input signal by one sampling period, multipliers ML for multiplying the outputs of the delay elements by coefficients $h_0$, $h_1$, $h_2$, . . . , and adders AD for adding the outputs of the multipliers.

FIGS. 17A and 17B are views for describing the secondary-noise propagation system 23. As shown in FIG. 17A, noise-canceling sounds generated by speakers $SP_1$–$SP_M$ arrive at the microphones $MIC_1$–$MIC_L$, which are provided at the respective observation points, upon propagating through the secondary propagation system 23 having a prescribed frequency and predetermined phase characteristics. Accordingly, if we let $C_{ji}$ represent the transfer characteristic of a secondary-noise propagation system in which a canceling sound based upon an i-th noise-canceling signal $Y_{ain}$ reaches the j-th microphone $MIC_j$, the secondary-noise propagation system 23 will have the form of the model shown in FIG. 17B and the transfer-function matrix (C) thereof will be as follows:

$$(C) = \begin{pmatrix} C_{11} & C_{12} & C_{13} & \ldots & C_{1M} \\ C_{21} & C_{22} & C_{23} & \ldots & C_{2M} \\ & & \cdot & & \\ & & \cdot & & \\ & & \cdot & & \\ C_{L1} & C_{L2} & C_{L3} & \ldots & C_{LM} \end{pmatrix}$$

Each element of the transfer-function matrix (C) is implemented by a FIR-type digital filter shown in FIG. 16, just as in the case of the primary-sound hypothetical propagation system 22. More specifically, each element is realized by a digital filter comprising delay elements DL for successively delaying the input signal by one sampling period, multipliers ML for multiplying the outputs of the delay elements by coefficients $c_0$, $c_1$, $c_2$, . . . , and adders AD for adding the outputs of the multipliers.

FIG. 18 is a block diagram showing the filtered-X signal-producing filter 21*b* fabricated using each element $C_{ij}$ of the transfer-function matrix (C) of the secondary-sound propagation system 23.

The adaptive signal processor 21*c* updates the coefficients of the adaptive filter 21*a* by executing an adaptive signal processing based upon the reference signals $x_{a1n}$–$x_{aKn}$ and the signals $e_n$–$e_{Ln}$ that are a composite of the noise and the noise-canceling sounds at each of the observation points, and the adaptive filter 21*a*, to which the reference signals $x_{a1n}$–$x_{aKn}$ are applied as inputs; generates the noise-canceling signals $Y_{a1n}$–$Y_{aMn}$ and applies these signals to the speakers to cancel out the sound at each observation point.

The noise-canceling signals $Y_{a1n}$–$Y_{aMn}$ output by the adaptive filter 21*a* do not reach the observation points as is. Rather, they reach the observation points upon being influenced by the frequency and phase characteristics of the secondary-sound propagation system 23. As a consequence, the adaptive signal processor 21*c* performs highly sophisticated noise-canceling control, not by using the reference signals $x_{a1n}$–$xaK_n$ as is, but by employing a filtered-X LMS (multiple-error filtered X LMS, referred to as an "MEFX LMS") algorithm, which uses signals obtained by impressing the characteristics of the secondary-sound propagation system 23 on the reference signals. In other words, on the basis of the filtered-X LMS algorithm, the adaptive signal processor 21*c* updates the coefficients of the adaptive filter 21*a* using signals $r_{111n}$–$r_{LMKn}$, which are a result of filtering the reference signals $x_{a1n}$–$xaK_n$ by the filter 21*b*, and the composite-sound signals (error signals) $e_{1n}$–$e_{Ln}$ at the observation points.

In FIG. 18, $C_{ij}$ represents a FIR-type digital filter for realizing each element $C_{ij}$ (see FIG. 17) of the transfer-function matrix (C) in the secondary-sound propagation system 23. The filter 21*b* is adapted so as to output the filtered-X signals $r_{111n}$–$r_{LMKn}$ upon impressence all of the propagation elements upon each of the refersignals signals $x_{a1n}$–$x_{aKn}$ (i.e., passing each reference signals through filters corresponding to all of the propagation elements). More specifically, the propagation elements $C_{11}$–$C_{L1}$ from the first speaker to all of the observation points are made to act upon the reference signal $x_{a1n}$to produce the filtered-X signals $r_{111n}$–$r_{L11n}$; the propagation elements $C_{12}$–$C_{L2}$ from the second speaker to all of the observation points are made to act upon the reference signal xa1n to produce the filtered-X signals $r_{121n}$–$r_{L21n}$, . . . ; and the propagation elements $C_{1M}$–$C_{LM}$ from the M-th speaker to all of the observation points are made to act upon the reference signal xa1n to produce the filtered-X signals $r_{1M1n}$–$r_{LM1n}$. All of the propagation elements are made to act upon each of the reference signals $x_{a2n}$, $x_{a3n}$, . . . $x_{aKn}$ in a similar manner. This may be expressed as follows:

$$R_{11} = (r_{111n}, r_{211n}, \ldots r_{L11n})$$

$$R_{21} = (r_{121n}, r_{221n}, \ldots r_{L21n})$$

$$\vdots$$

$$R_{M1} = (r_{1M1n}, r_{2M1n}, \ldots r_{LM1n})$$

$$\vdots$$

$$R_{MK} = (r_{1MKn}, r_{2MKn}, \ldots r_{LM1n})$$

FIG. 19 is a block diagram showing the multiple-input/multiple-output adaptive filter 21*a*, which has a structure similar to that of the primary-sound hypothetical propagation system 22 or secondary-sound propagation system 23. FIR-type digital filters are shown at A11$_n$–$A_{MKn}$. By way of example, each of these filters may be realized by delay elements $D_{L1}$, $D_{L2}$. . . for successively delaying the input signal by one sampling period, multipliers ML1, ML2, ML3 . . . for multiplying each delay-element output by coefficients $a_0$, $a_1$, $a_2$. . ., and adders $AD_1$, $AD_2$. . . for adding the multiplier outputs. The number of delay stages is not limited to two.

The noise-canceling signal $y_{a1n}$ input to the first speaker is obtained by inputting the reference signals $x_{a1n}$–$x_{aKn}$ to the digital filters $A_{11n}$–$A_{1Kn}$ and then adding. The noise-canceling signal $y_{a2n}$ input to the second speaker is obtained by inputting the reference signals $x_{a1n}$–$x_{aKn}$ to the digital filters $A_{21n}$–$A_{2Kn}$ and then adding. The noise-canceling signal $y_{aMn}$ input to the M-th speaker is obtained by inputting the reference signals $x_{a1n}$–$x_{aKn}$ to the digital filters $A_{M1n}$–$A_{MKn}$ and then adding.

When each of the FIR-type digital filters $A_{11n}$–$A_{MKn}$ in the adaptive filter 21*a* is composed of three coefficients (two delay stages), the adaptive signal processor 21*c* decides the values of the coefficients by executing an adaptive signal processing for each of the three coefficients of the FIR-type digital filters $A_{11n}$–$A_{MKn}$. That is, the adaptive signal processor decides coefficients $a_0$, $a_1$, $a_2$ by performing the following operation with regard to these coefficients $a_0$, $a_1$, $a_2$ of one FIR-type digital filter $A_{ijn}$:

$$\begin{pmatrix} a_0(n+1) \\ a_1(n+1) \\ a_2(n+1) \end{pmatrix} = \begin{pmatrix} a_0(n) \\ a_1(n) \\ a_2(n) \end{pmatrix} - \mu \begin{pmatrix} R_{ij}(n) \\ R_{ij}(n-1) \\ R_{ij}(n-2) \end{pmatrix} e_n \quad (1)$$

where $$\begin{aligned} R_{ij} &= x_{ajn}(C_i) \\ &= x_{ajn}(C_{1i}, C_{2i}, C_{3i}, \ldots, C_{Li}) \\ &= (r_{1ijn}, r_{2ijn}, \ldots, r_{Lijn}) \end{aligned} \quad (2)$$

-continued $$e_n = \begin{pmatrix} e_{1n} \\ e_{2n} \\ \cdot \\ \cdot \\ \cdot \\ e_{Ln} \end{pmatrix} \quad (3)$$

In the equation (1), the symbol (n) signifies the value at the present sampling time, (n−1) the value at the preceding sampling time, (n−2) the value at the sampling time two samplings before the present sampling time, and (n+1) the value from the present time to the next sampling time. Accordingly, the symbol $R_{ij}(n-2)$ signifies the output of the filter 21*b* that conforms to the reference signal at the sampling time two samplings before the present sampling time, $R_{ij}(n-1)$ signifies the output of the filter that conforms to the reference signal at the preceding sampling time, and $R_{ij}(n)$ signifies the output of the filter that conforms to the reference signal at the present time. The symbol $\mu$ represents a constant (step-size parameter) of not more than 1 for deciding a step (degree) at which the coefficient of the adaptive filter is updated, and $\mu$ is set to an appropriate value in accordance with the noise,canceling system. The larger the value of the step-size parameter $\mu$ is, the faster the coefficient of the adaptive filter approaches the optimum value and the better the followability becomes. However, an overshoot is generated when the value of $\mu$ approaches the optimum value, which deteriorates the stability. On the other hand, the smaller the value of the step-size parameter $\mu$ is, the slower the coefficient of the adaptive filter approaches the optimum value and the worse the followability becomes. However, the overshoot is small when the value of $\mu$ approaches the optimum value, thereby ameliorating the stability. The symbol $e_n$ represents the signal (error signal) that is the composite of the noise and the noise-canceling sound at each of the L-number of observation points.

In accordance with this noise-canceling apparatus, the adaptive signal processor 21*c* decides the coefficients of the FIR-type digital filters $A_{11n}$–$A_{MKn}$, which constitute the adaptive filter 21*a*, by executing an adaptive signal processing based upon the filtered-X signals $r_{111n}$–$r_{LMKn}$, which are output by the filter 21*b*, and the composite-sound signals (error signals) $e_{1n}$–$eL_n$ that are composites of the noise and noise-canceling sounds at the respective observation points. The adaptive filter 21*a*, to which the reference signals $x_{a1n}$–$x_{aKn}$ are applied, generates the noise-canceling signals $Y_{a1n}$–$Y_{aMn}$ and applies these signals to the speakers $SP_1$–$SP_M$ (FIG. 17). Each speaker generates a noise-canceling sound to cancel out the noise at each observation point.

FIG. 20 is a block diagram illustrating the details of the conventional noise-canceling apparatus for a case in which there is one noise source (K=1), two speakers (M=2) and two observation points, i.e., two microphones (L=2). This conventional noise-canceling apparatus is used, for example, for canceling the engine noise at the two front seats (driver's seat and passenger's seat) in an automotive vehicle.

The reference numeral 21*a* denotes the adaptive filter, which is composed of two FIR-type digital filters $A_{11n}$, $A_{21n}$; the numeral 21*b* the filtered-X signal producing filter, which is obtained by using digital filters to construct each of the propagation elements $C_{11}$, $C_{21}$, $C_{12}$, $C_{22}$ of the transfer-function matrix of the secondary propagation system; and the numerals 21*c*-1 and 21*c*-2, adaptive signal processors (MEFX LMS) for deciding the coefficients of each of the digital filters in the adaptive filter 21*a*. The symbols $SP_1$ and $SP_2$ represent speakers which are placed under the two seats, and $MC_1$ and $MC_2$ designate microphones disposed at the observation points (points in the vicinity of the ears of the passengers). The operations of the adaptive signal processor, the adaptive filter, and the filtered-X signal producing filter are executed by one DSP (digital signal processor).

FIG. 21 is a block diagram illustrating the details of the conventional noise-canceling apparatus for a case in which there are one noise source (K=1), four speakers (M=4) and four observation points, i.e., four microphones (L=4). This conventional noise-canceling apparatus is used for canceling the engine noise at the two front seats and the two back seats in an automotive vehicle.

The reference numeral 21*a* denotes the adaptive filter, which is composed of four FIR-type digital filters $A_{11n}$, $A_{21n}$, $A_{12n}$, $A_{22n}$, and numeral 21*b* denotes the filtered-X signal producing filter, which is obtained by using digital filters to construct each of the propagation elements $C_{11}$, $C_{21}$, $C_{31}$, $C_{41}$. . ., $C_{44}$ of the transfer-function matrix of the secondary propagation system. Numerals $\mathbf{21}_{c\text{-}1}$ through $\mathbf{21}_{c\text{-}4}$ denote adaptive signal processors (MEFX LMS ), $SP_1$–$SP_4$ represent speakers, and $MC_1$–$MC_4$ designate microphones disposed at the observation points. The operations of the adaptive signal processor, the adaptive filter, and the filtered-X signal producing filter are executed by one DSP (digital signal processor).

When canceling the engine noise, only a second harmonic component which is contained in the engine noise is usually canceled. In the case of a four-cylinder engine, however, the engine noise contains not only the second harmonic component but also fourth, sixth, . . . harmonic component, although the levels thereof are lower, as shown in FIG. 22. In addition, harmonic components of odd ordinals are generated in some types of automotive vehicle. The silencing effect produced by a system for which cancels only the second harmonic is therefore insufficient for auditory sensation.

In order to improve the silencing effect, a method of canceling the harmonic components by performing the adaptive signal processing of harmonic components of high levels (for example, second, fourth and sixth harmonic components) among the harmonic components contained in the engine noise, separately from each other may be adopted.

FIG. 23 shows the structure of a conventional noise-canceling apparatus for canceling the second, fourth and sixth harmonic components which are contained in the engine noise. The same reference numerals are provided for the same elements as those shown in FIG. 12. This apparatus is different from that shown in FIG.12 in the following points:

(1) A noise-canceling controller 14-1 for canceling a second harmonic component, a noise-canceling controller 14-2 for canceling a fourth harmonic component, and a noise-canceling controller 14-3 for canceling a sixth harmonic component are provided separately from each other, (2) Reference that reference signals $x_{2n}$, $x_{4n}$ and $x_{6n}$ of second, fourth and sixth harmonics, respectively, of the engine rotational speed are generated from the reference signal generator 13 and are input to the noise-canceling controllers 14-1, 14-2, and 14-3, respectively, (3) that adders 14-4 and 14-5 which add the outputs $N_{c2}$, $N_{c4}$, and $N_{c6}$ of the respective noise-canceling controllers and output the result as a noise-canceling signal $N_c$ are provided, and (4) that the composite-sound signal (error signal) $e_n$ detected by the error microphone 17 is fed back to each of the noise-canceling controllers 14-1, 14-2 and 14-3.

The noise-canceling controllers 14-1, 14-2 and 14-3 for canceling the respective harmonics execute the above-described adaptive signal processings in accordance with the coefficient updating equation (1) on the basis of the reference signals $x_{2n}$, $x_{4n}$ and $x_{6n}$, the composite-sound signal $e_n$ and the step-size parameter $\mu$, decides the coefficients of the respective adaptive filters (not shown), input the reference signals $x_{2n}$, $x_{4n}$ and $x_{6n}$ to the adaptive filters, and output the noise-canceling signals $N_{c2}$, $N_{c4}$ and $N_{c6}$. The adders 14-4 and 14-5 add the outputs $N_{c2}$, $N_{c4}$ and $N_{c6}$ of the respective noise-canceling controllers and output the result as the noise-canceling signal $N_c$ to the DA converter 14c. The DA converter 14c converts the noise-canceling signal $N_c$ into the analog noise-canceling signal, inputs the analog noise-canceling signal into the speaker, and outputs the noise-canceling sound.

If it is assumed that the fourth harmonic frequency of the current engine rotational speed is represented by $f_0$, the frequency characteristic of the adaptive filter in the state in which the fourth harmonic is canceled by the fourth harmonic noise-canceling controller 14-2 is as indicated by the solid line in FIG. 24. That is, the frequency characteristic of the adaptive filter of the fourth harmonic noise-canceling controller 14-2 forms a sharp trough at the frequency of $f_0$. Even if the frequency characteristic of the adaptive filter of the fourth harmonic noise-canceling controller 14-2 forms such a trough, there is no problem if the adaptive control follows a slight change in the engine rotational speed (the fourth harmonic frequency changes from $f_0$ to $f_1$) so that the frequency characteristic of the adaptive filter quickly changes from the solid line to the broken line in FIG. 24. If the adaptive control is delayed, however, the gain rapidly increases by $g_L$ and the noise-canceling output for the fourth harmonic is rapidly expanded, so that the engine noise is increased (noise increasing phenomenon) far from being canceled out. The same problem is caused with regard to a sixth harmonic.

After the composition of the outputs of the second, fourth and sixth adaptive filters, the composite-sound signal is converted into an analog signal by the DA converter 14c and input to the speaker. However, the outputs of the fourth and sixth adaptive filters are lower than the output of the second adaptive filter by 10 to 20 dB. Since the DA converter 14c is designed in such a manner that the resolving power thereof is high at the output level of the second adaptive filter, the S/N of the DA converter 14c is low to the fourth and sixth harmonics.

The step-size parameter $\mu$ in the coefficient updating equation (1) is determined so as to be able to cancel the engine noise while satisfying both the followability and the stability. The second harmonic component which is dominant in the engine noise, that is, which has the highest noise level, is therefore canceled out while satisfying both the followability and the stability. However, when the other harmonic components of a lower level are canceled by using the coefficient updating equation (1), the noise-canceling signals $N_{c4}$ *and* $N_{c6}$ output from the noise-canceling controllers 14-2 and 14-3 sometimes become too large. In such a case, these noise-canceling signals can not cancel the fourth and the sixth harmonic components, and rather produce another noise. For this reason, a method of reducing the values $\mu$ for the harmonic components other than the second harmonic component in the coefficient updating equation may be adopted. If $\mu$ is reduced, however, the followability is deteriorated, so that it is impossible to quickly follow and cancel the noise (harmonic components) which changes moment by moment.

In the conventional method of canceling a plurality of harmonic components, it is necessary to provide noise-canceling controllers having the DSP structure for the respective harmonic components, which requires a large-scale hardware structure and raises the manufacturing cost. On the other hand, if the adaptive signal processing of each harmonic component is executed by using only one noise-canceling controller, the amount of operation by the DSP becomes very large and it is necessary to reduce the number of taps (number of stages) of the filtered-X signal producing filter or the adaptive filter, which makes it impossible to output a noise-canceling signal that satisfies the followability. Another possible measure is a method of inputting the composite reference signals of all the harmonic components into one noise-canceling controller, thereby executing the adaptive signal processings in block by the noise-canceling controller. In such a method, however, since harmonic components of a high level are mainly canceled, the cancellation of harmonic components of a lower level are insufficient. As a result, the harmonic components of a lower level are offensive to the ear.

SUMMARY OF THE INVENTION

Accordingly, it is an object of the present invention to eliminate the above-described problems in the related art and to provide a noise-canceling method which is capable of avoiding the noise increasing phenomenon.

It is another object of the present invention to provide a noise-canceling method which is capable of improving the S/N of the system.

It is still another object of the present invention to provide a noise-canceling method which is capable of canceling each harmonic component contained in the engine noise with a good followability.

It is a further object of the present invention to provide a noise-canceling method which is capable of solving the problem of the noise increasing phenomenon by preventing the noise-canceling signals for the harmonic components other than the harmonic components of the highest level, for example, the fourth and the sixth harmonic components from becoming too large.

It is a still further object of the present invention to provide a noise-canceling method which is capable of effectively canceling the harmonic components of a low level as well as the harmonic components of a high level by using one noise-canceling controller.

It is a still further object of the present invention to provide a noise-canceling method which constantly cancels the second harmonic component having the highest level, and selects the harmonic components which are to be canceled in accordance with the engine rotational speed so as to reduce the number of harmonic components which are to be canceled, thereby reducing the number of necessary noise-canceling controllers.

It is a still further object of the present invention to provide a noise-canceling method which cancels the engine noise by freely switching the combinations of the harmonic components of the engine noise which are to be silenced, by a switch or the like, depending on the type of automotive vehicle or the auditory sensation of a passenger.

To achieve this aim, in a first aspect of the present invention there is provided a noise-canceling method comprising the steps of:

generating reference signals corresponding to the respective harmonic components of the engine rotational speed which are contained in the engine noise;

generating a noise-canceling signal by executing an adaptive signal processing by using each reference signal and a composite-sound signal and inputting the noise-canceling signal to a speaker; and outputting a predetermined harmonic component from a speaker for generating a noise-canceling sound or another speaker so that the levels of the harmonic components become approximately equivalent to one another at the noise-canceling point.

According to this noise-canceling method, it is possible to make the levels of the harmonic components approximately equivalent to one another at the noise-canceling point. It is therefore possible to equally cancel the harmonic components and obtain the frequency characteristic of the adaptive filter of the fourth and the sixth harmonics shown in a gentle curve. As a result, even if the adaptive control is delayed by a change in the engine rotational speed, the gain does not increase rapidly and the noise increase phenomenon is prevented. It is also possible to equalize the levels of the noise-canceling signals of the harmonics, enhance the resolving power of the DA converter, and improve the signal-to-noise ratio (hereinunder referred to as "S/N") of the system.

In a second aspect of the present invention, there is provided a noise-canceling method comprising:

executing an adaptive signal processing of the harmonic component of the highest level among the harmonic components of the engine rotational speed which are contained in the engine noise, in accordance with a first coefficient updating equation which does not incorporate an output limiting term for limiting the amplitude of the output signal of the adaptive filter;

executing the adaptive signal processing of other harmonic components in accordance with the a second coefficient updating equation which incorporates an output limiting term for limiting the amplitude of the output signal of the adaptive filter; and generating a noise-canceling signal by adding the output signals output from adaptive filters.

According to this noise-canceling method, since the adaptive signal processing of the harmonic component of the highest level (second harmonic component) is executed in accordance with the first coefficient updating equation which does not incorporate an output limiting term for limiting the amplitude of the output signal of the adaptive filter, it is possible to cancel the second harmonic component while satisfying both the followability and the stability. With regard to the other harmonics (for example, fourth and sixth harmonics), the coefficient of the adaptive filter is decided in such a manner that if the output of the adaptive filter becomes too large, the output is limited to that degree, thereby preventing the canceling-sound signals for the harmonic components other than the second harmonic component from becoming too large.

In a third aspect of the present invention, there is provided a noise-canceling method comprising the steps of:

providing a common noise-canceling controller for the harmonics of all levels;

generating reference signals corresponding to the respective harmonic components of a level higher than 2 among the harmonic components of the engine rotational speed which are contained in the engine noise;

controlling the amplitude of the reference signals so that the lower the level of the harmonic component is, the larger the amplitude of the reference signal corresponding to the harmonic component becomes;

generating a composite reference signal from the reference signals whose amplitudes are controlled;

executing an adaptive signal processing by using the composite-sound signal of the engine noise and the noise-canceling sound at the noise-canceling point, the composite reference signal, and the step-size parameter; and canceling the engine noise at the noise-canceling point by inputting the noise-canceling signal obtained by the adaptive signal processing to the noise-canceling sound generating source.

According to this noise-canceling method, the step-size parameters of the harmonic components of a low level become equivalently large, the amount of harmonic components of a low level canceled increases, and the engine noise is canceled by one noise-canceling controller with a good followability, so that the engine noise of the harmonic components of a low level is not offensive to the ear. In addition, since the level of the reference signal corresponding to each harmonic component is controlled in accordance with the engine rotational speed, the amount of harmonic components of a low level canceled increases at every engine rotational speed and it is possible to cancel the engine noise with a good followability.

In accordance with a fourth aspect of the present invention, there is provided a noise-canceling apparatus comprising the steps of:

providing a first noise-canceling controller corresponding to the harmonic component of the highest level and a second noise-canceling controller corresponding to other harmonic components;

constantly canceling the harmonic component of the highest level by the adaptive signal processing of the first noise-canceling controller; and canceling the harmonic component decided in accordance with the engine rotational speed or designated by a switch, by the adaptive signal processing of the second noise-canceling controller.

According to this noise-canceling method, it is possible to reduce the number of harmonic components which are to be canceled and, hence, the number of noise-canceling controllers. In addition, even if the combinations of the harmonic components of the engine noise which are to be silenced are different depending on the type of automotive vehicle or the auditory sensation of the passenger, it is possible to effectively cancel the engine noise by freely switching and designating the combinations of the harmonic components of the engine noise which are to be silenced by a switch or the like.

Other features and advantages of the present invention will be apparent from the following description taken in conjunction with the accompanying drawings.

BRIEF DESCRIPTION OF THE DRAWINGS

FIG. 8 is a table explaining the engine rotational speed ranges in correspondence with the gain of each amplifier;

DESCRIPTION OF THE PREFERRED EMBODIMENTS (a) First Embodiment

Figure 1:
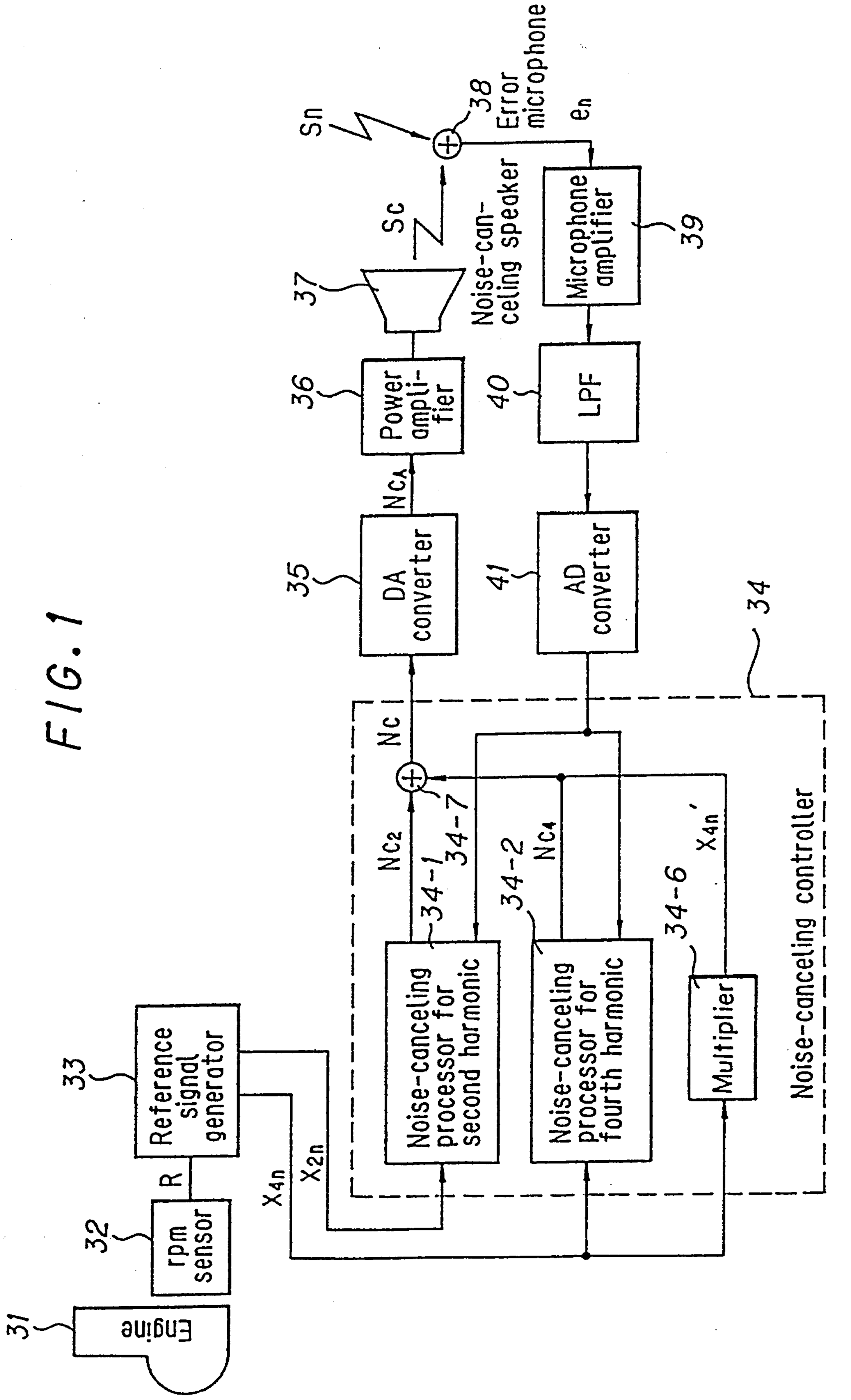
FIG. 1 shows the structure of a first embodiment of a noise-canceling method according to the present invention.
Figure 2:
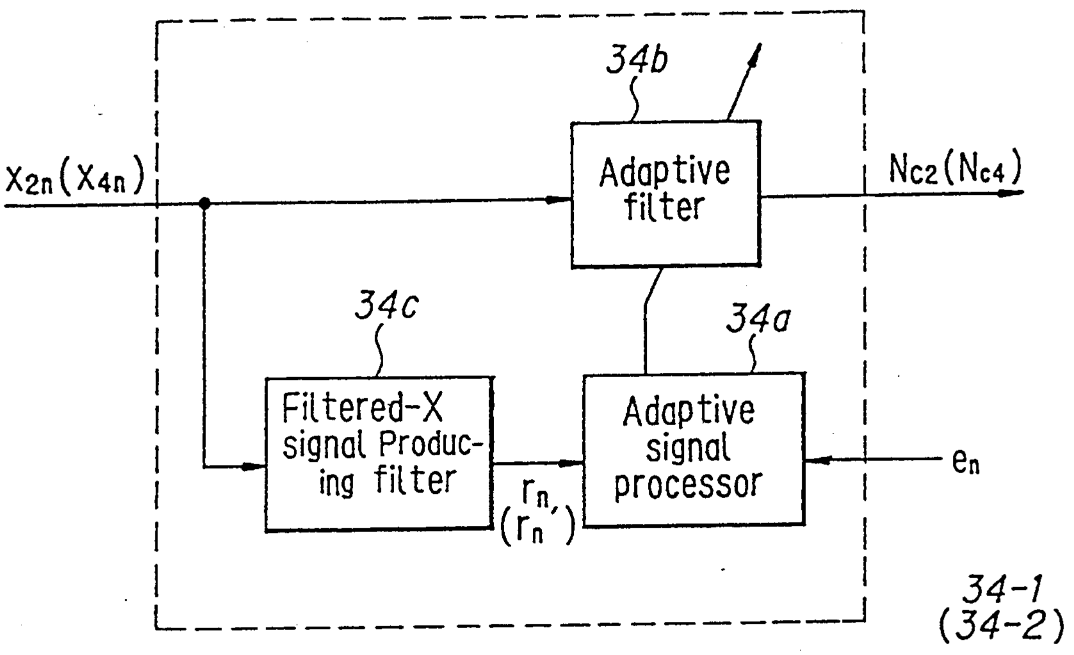
FIG. 2 PRIOR ART
FIG. 2 shows the structure of each noise-canceling processor in the first embodiment shown in FIG. 1.

FIG. 1 shows the structure of a first embodiment of a noise-canceling method according to the present invention. This embodiment is used for canceling a second harmonic component and a fourth harmonic component among the higher harmonic components of the engine rotational speed.

Entire structure

In FIG. 1, the reference numeral 31 represents an engine as a noise source, 32 a rotational speed sensor for detecting the engine rotational speed R, and 33 a reference signal generator for outputting sinusoidal signals (digital signals) of a second harmonic and a fourth harmonic as reference signals $x_{2n}$ and $x_{4n}$, respectively, in correspondence with the engine rotational speed R.

The reference numeral 34 represents a noise-canceling controller having a DSP structure for executing an adaptive signal processing so as to cancel the engine noise at the noise-canceling point (observation point) within the passenger compartment. The noise-canceling controller 34 is provided with a noise-canceling processor 34-1 for canceling a second harmonic component, a noise-canceling processor 34-2 for canceling a fourth harmonic component, a multiplier 34-6 for multiplying the reference signal $x_{4n}$ of the fourth harmonic by a constant K and an adder 34-7 for adding the outputs $N_{c2}$, $N_{c4}$ of the noise-canceling processors 34-1, 34-2 and the output $x_{4n}'$ of the multiplier 34-6, and outputting the sum as a noise-canceling signal $N_c$.

The reference numeral 35 denotes a DA converter for converting the output (noise-canceling signal $N_c$) of the adder 34-7 into an analog noise-canceling signal $N_{CA}$. The reference numeral 36 denotes a power amplifier for amplifying the noise-canceling signal $N_{CA}$, 37 a noise-canceling speaker for emitting a noise-canceling sound $S_c$ and, 38 an error microphone disposed at the noise-canceling point so as to detect the composite sound of the noise $S_n$ and the noise-canceling sound $S_c$ and output a composite-sound signal as the error signal $e_n$. The reference numeral 39 denotes a microphone amplifier for amplifying the error signal $e_n$; 40 a low-pass filter for eliminating noise signals outside the band of harmonic noise which is to be cancelled; and 41 an AD converter for converting the output of the low-pass filter into digital data and inputting the digital data into the noise-canceling controller 34 having a DSP structure.

Noise-canceling processor

Each of the noise-canceling processors 34-1, 34-2 is composed of an adaptive signal processor **34*a*, an adaptive filter 34*b* and a filtered-X signal producing filter 34*c***.

The filtered-X signal producing filter **34*c* of the noise-canceling processor 34-1 produces a filtered-X signal (reference signal for a signal processing) $r_n$ by superimposing, on the reference signal $x_{2n}$ of a second harmonic, the propagation characteristic (transfer function) of all the cancel-sound propagation system. The adaptive signal processor 34*a* determines the coefficient of the adaptive filter 34b by the adaptive signal processing based on the filtered-X signal $r_n$ and the composite-sound signal (error signal) $e_n$ at the observation point. The adaptive filter 34b** receives the reference signal $x2_n$ of a second harmonic and outputs the noise-canceling signal $N_{c2}$ for canceling the second harmonic component.

The filtered-X signal producing filter 34c of the noise-canceling processor 34-2 produces a filtered-X signal (reference signal for a signal processing) $r_n$ by superimposing, on the reference signal $x4_n$ of a fourth harmonic, the propagation characteristic (transfer function) of all the cancel-sound propagation system. The adaptive signal processor 34a determines the coefficient of the adaptive filter 34b by the adaptive signal processing based on the filtered-X signal $r_n$ and the composite-sound signal (error signal) $e_n$ at the observation point, and the adaptive filter 34b receives the reference signal $x4_n$ of a fourth harmonic and outputs the noise-canceling signal $N_{c4}$ for canceling the fourth harmonic component.

Entire operation

When the engine 31 rotates, its rotational speed R is detected by the rotational speed sensor 32. In addition, the reference signal generator 33 generates the reference signals $x2_n$ and $x4_n$ of a second harmonic and a fourth harmonic, respectively, whose frequencies conform to the engine rotational speed R, and the reference signals $x2_n$ and $x4_n$ are input to the noise-canceling controller 34. At this time the periodic engine noise (periodic noise) generated by the engine 31 reaches the noise-canceling point upon propagating through space having a noise propagation system (a primary-noise propagation system) that exhibits a predetermined transfer function.

The noise-canceling processors 34-1, 34-2 fetch the reference signals $x2_n$, $x4_n$ of the second harmonic and the fourth harmonic in synchronism with a sampling pulse (not shown). When the reference signal $x2_n$ is fetched by the noise-canceling processor 34-1, the noise-canceling processor 34-1 superimposes the propagation characteristic of all the cancel-sound propagation system on the reference signal $x2_n$, and produces the filtered-X signal $r_n$, which is used for an LMS adaptive signal processing. Thereafter, the noise-canceling processor 34-1 executes an LMS adaptive signal processing in accordance with the following coefficient updating equation (1) on the basis of the error signal $e_n$ and the filtered-X signal $r_n$, then subjects the reference signal $x_{n2}$ to a digital filtering processing in accordance with the coefficient decided by the adaptive signal processing and outputs the noise-canceling signal $N_{c2}$.

$$\begin{pmatrix} a_0(n+1) \\ a_1(n+1) \\ a_2(n+1) \end{pmatrix} = \begin{pmatrix} a_0(n) \\ a_1(n) \\ a_2(n) \end{pmatrix} - \mu \begin{pmatrix} R_{ij}(n) \\ R_{ij}(n-1) \\ R_{ij}(n-2) \end{pmatrix} e_n \tag{1}$$

where $$\begin{aligned} R_{ij} &= x_{ajn}(Ci) \\ &= x_{ajn}(C_{ii}, C_{2i}, C_{3i}, \ldots, C_{Li}) \\ &= (r_{1ijn}, r_{2ijn}, \ldots, r_{Lijn}) \end{aligned} \tag{2}$$

-continued $$e_n = \begin{pmatrix} e_{1n} \\ e_{2n} \\ \cdot \\ \cdot \\ \cdot \\ e_{Ln} \end{pmatrix} \tag{3}$$

In the equation (1), the symbol (n) signifies the value at the present sampling time, (n−1) the value at the preceding sampling time, (n−2) the value at the time two samplings before the present sampling time, and (n+1) the value from the present time to the next sampling time.

When the reference signal $x4_n$ is fetched by the noise-canceling processor 34-2, the noise-canceling processor 34-2 superimposes the propagation characteristic of all the cancel-sound propagation system on the reference signal $x4_n$, and produces a filtered-X signal $r_n'$, which is used for an LMS adaptive signal processing. Thereafter, the noise-canceling processor 34-2 executes an LMS adaptive signal processing in accordance with the equation (1) on the basis of the error signal $e_n$ and the filtered-X signal $r_n'$, then subjects the reference signal $x4_n$ to a digital filtering processing in accordance with the coefficient decided by the adaptive signal processing and outputs the noise-canceling signal $N_{c4}$.

The multiplier 34-6 multiplies the reference signal $x4_n$ of the fourth harmonic by a constant K and outputs the product to the adder 34-7. The adder 34-7 adds the outputs $N_{c2}$ and $N_{c4}$ of the noise-canceling processors 34-1 and 34-2 and the output $x4_n'$ of the multiplier 34-6 and inputs the sum into the DA converter 35 as a noise-canceling signal $N_c$. The DA converter 35 converts the noise-canceling signal $N_c$ into an analog noise-canceling signal and inputs it into the noise-canceling speaker 37 through the power amplifier 36. In this way, the noise-canceling speaker 37 emits the noise-canceling sound $S_c$ so that the noise-canceling sound $S_c$ reaches the noise-canceling point through a secondary-sound propagation system and cancels the noise.

The composite sound of the noise-canceling sound $S_c$ and the noise $S_n$ at the observation point is detected by the error microphone 38, and the detected composite sound is input to the noise-canceling controller 34 through the microphone amplifier 39, the low-pass filter 40 and the AD converter 41. This cycle of noise-canceling processing is repeated with a predetermined period so as to cancel the noise at the observation point.

In this noise-canceling control, the noise-canceling sound $S_c$ output from the noise-canceling speaker 37 contains the sound based on the reference signal $x4_n'$ of the fourth harmonic which is multiplied by a constant K by the multiplier 34-6. For this reason, the fourth harmonic component of the noise at the observation point is apparently increased to the same degree as the second harmonic component.

Figure 3:
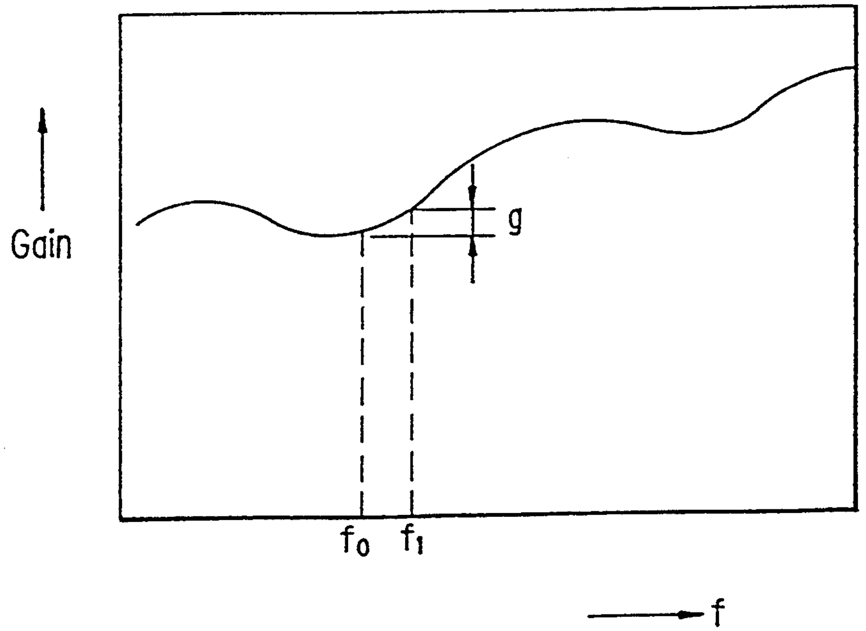
FIG. 3 shows the frequency characteristic of an adaptive filter for a fourth harmonic in the first embodiment.
Figure 24:
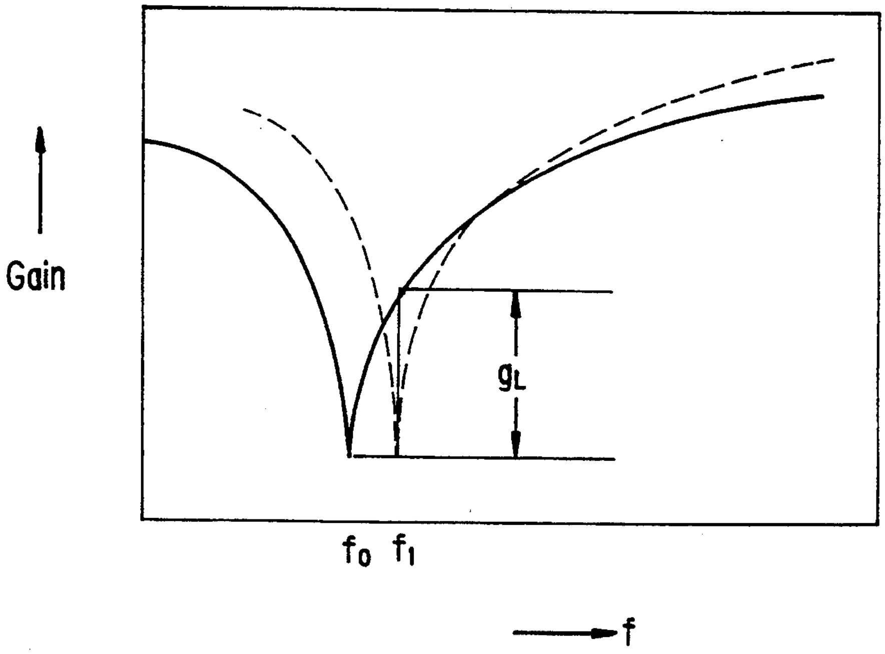
FIG. 24 shows the frequency characteristic of a conventional adaptive filter for the fourth harmonic.

When the second and the fourth harmonic components reach the same level, the noise-canceling signals $N_{c2}$, $N_{c4}$ output from the noise-canceling processors 34-1, 34-2 attain the same level, so that both harmonic components are canceled approximately equally. As a result, the frequency characteristic of the adaptive filter 34b of the noise-canceling processor 34-2 for a fourth harmonic becomes smooth (the sharp trough in FIG. 24 is eliminated), as shown in FIG. 3, so that even if the adaptive control is delayed when the engine rotational speed is changed, the gain does not increase rapidly, thereby being exempt from the noise increasing phenomenon.

In addition, the levels of the noise-canceling signals $N_{c2}$ and $N_{c4}$ become uniform, the resolution of the DA converter is enhanced, and the S/N of the system is improved.

Analog reference signals may be output from the reference signal generator 33 in place of the digital reference signals. In this case, an amplifier is provided in place of the multiplier 34-6, and the output of the amplifier is input to the noise-canceling speaker 37 in the form of a composite of the output of the amplifier and the output of the DA converter 35.

Although the fourth harmonic component is output from the noise-canceling speaker 37, it is possible to provide another speaker and output the fourth harmonic component from this speaker.

Although only the second and the fourth harmonic components are simultaneously cancelled in this embodiment, this embodiment is also adaptable to the simultaneous cancellation of second, fourth and sixth harmonic components.

According to the first embodiment, predetermined harmonic components are output from a noise-canceling speaker or another speaker so that the levels of the harmonic components at the noise-canceling point are equal to each other when the harmonic components of a level higher than 2 which are contained in the engine noise are simultaneously canceled. It is therefore possible to cancel the harmonic components equally and to make the frequency characteristic of the adaptive filters for fourth, sixth, . . . harmonics smooth. As a result, even if the adaptive control is delayed when the engine rotational speed is changed, the gain does not increase rapidly, thereby being exempt from the noise increasing phenomenon.

Furthermore, according to the first embodiment, the levels of the noise-canceling signals become uniform, the resolution of the DA converter is enhanced, and the S/N of the system is improved.

(b) Second Embodiment

Figure 4:
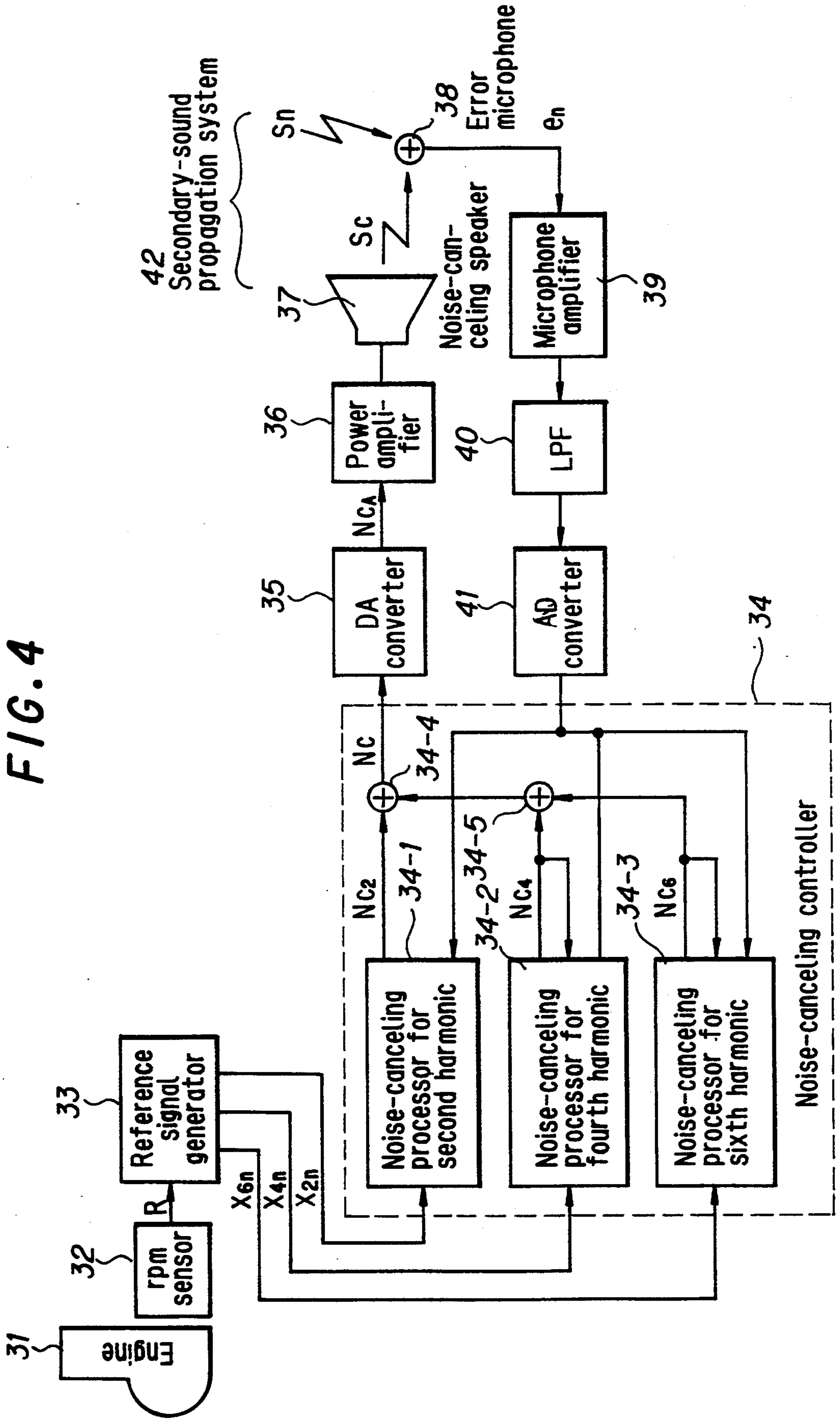
FIG. 4 shows the structure of a second embodiment of a noise-canceling method according to the present invention.

FIG. 4 shows the structure of a second embodiment of a noise-canceling method according to the present invention. This embodiment is used for canceling a second harmonic component, a fourth harmonic component and a sixth harmonic component among the higher harmonic components of the engine rotational speed.

Entire structure

In FIG. 4, the reference numeral 31 represents an engine as a noise source, 32 a rotational speed sensor for detecting the engine rotational speed R, and 33 a reference signal generator for outputting sinusoidal signals (digital signals) of a second harmonic, a fourth harmonic and a sixth harmonic as reference signals $x_{2n}$, $x_{4n}$ and $x_{6n}$, respectively, in correspondence with the engine rotational speed R. The reference numeral 34 represents a noise-canceling controller, wherein 34-1 represents a noise-canceling processor (noise-canceling controller) for a second harmonic, 34-2 represents a noise-canceling processor (noise-canceling controller) for a fourth harmonic, 34-3 represents a noise-canceling processor (noise-canceling controller) for a sixth harmonic, and 34-4 and 34-5 represents adders for adding the outputs $N_{c2}$, $N_{c4}$ and $N_{c6}$ of the noise-canceling processors 34-1, 34-2 and for 34-3, and outputting the sum as a noise-canceling signal $N_c$. The reference numeral 35 denotes a DA converter for converting the noise-canceling signal $N_c$ into an analog noise-canceling signal $N_{CA}$; 36 a power amplifier for amplifying the noise-canceling signal $N_{CA}$; 37 a noise-canceling speaker for emitting a noise-canceling sound $S_c$; 38 an error microphone disposed at the noise-canceling point so as to detect the composite sound of the noise $S_n$ and the noise-canceling sound $S_c$ and output a composite-sound signal as the error signal $e_n$; 39 a microphone amplifier; 40 a low-pass filter; and 41 an AD converter for converting error signal $e_n$ into a digital signal.

When the noise-canceling processors 34-1 to 34-3 receive the reference signals $x_{2n}$, $x_{4n}$ and $x_{6n}$ of the second, fourth and sixth harmonic components, respectively, from the reference signal generator 33, and also receive the composite-sound signal (error signal) $e_n$ of the noise $S_n$ and noise-canceling sound $S_c$ at the noise-canceling point in the passenger compartment. The noise-canceling processors 34-1 to 34-3 execute adaptive signal processings so that the harmonic components contained in the error signal are the minimum and output the noise-canceling signals $N_{c2}$, $N_{c4}$ and $N_{c6}$, respectively.

Noise-canceling processor for second harmonic

Figure 18:
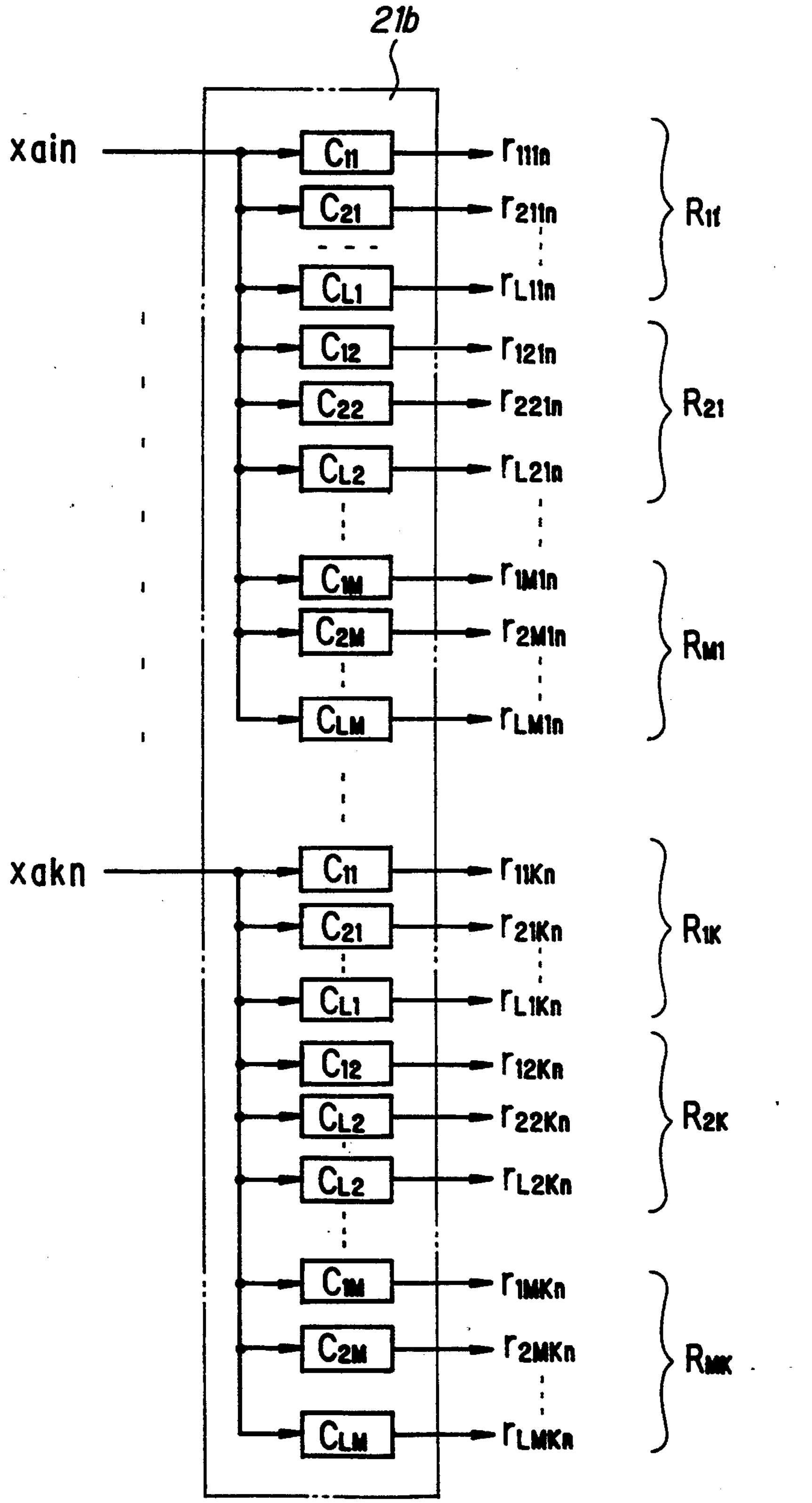
FIG. 18 (PRIOR ART)
FIG. 18 shows the structure of a filtered-X signal producing filter.
Figure 19:
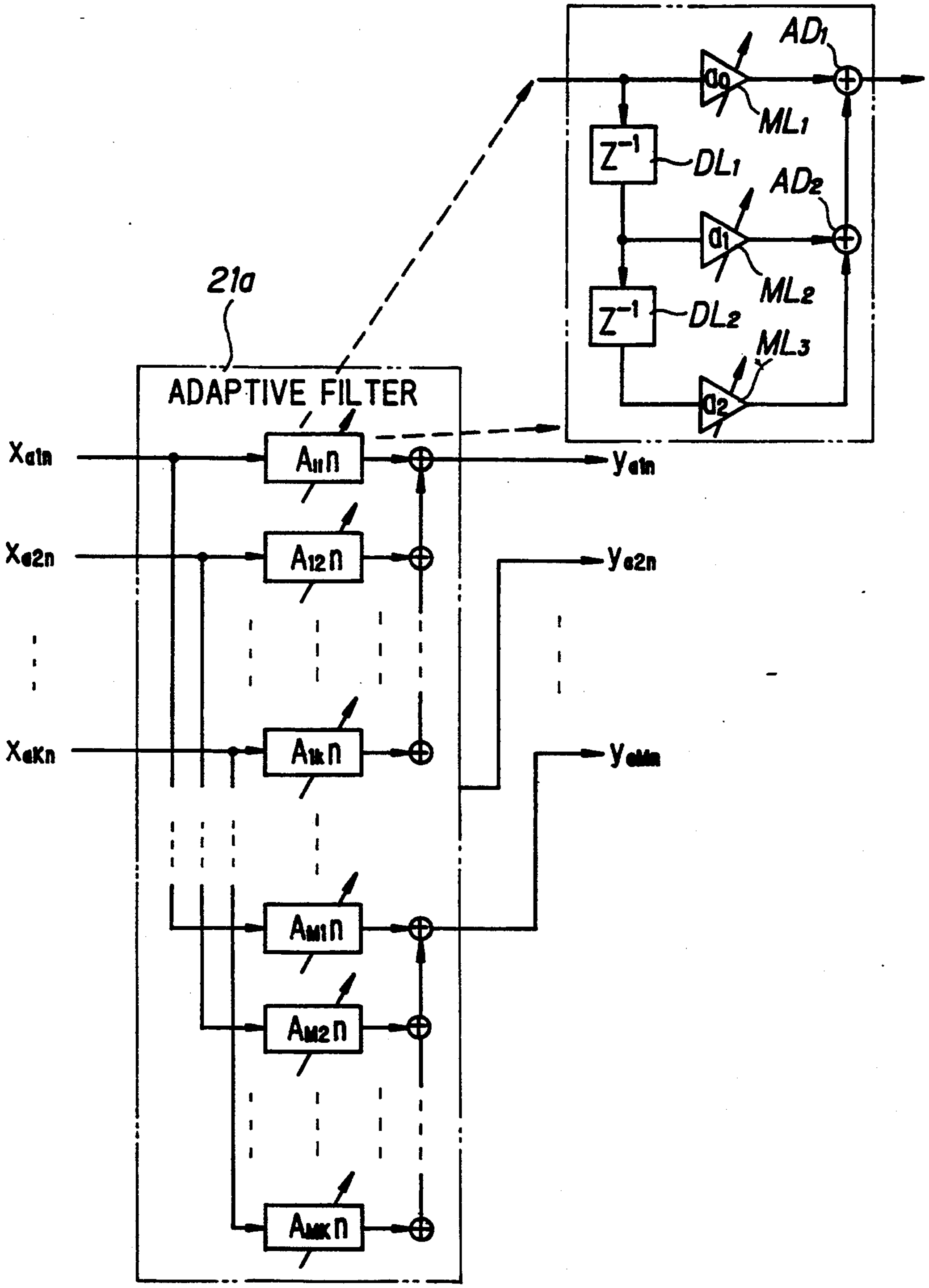
FIG. 19 (PRIOR ART)
FIG. 19 shows the structure of an adaptive filter.
Figure 20:
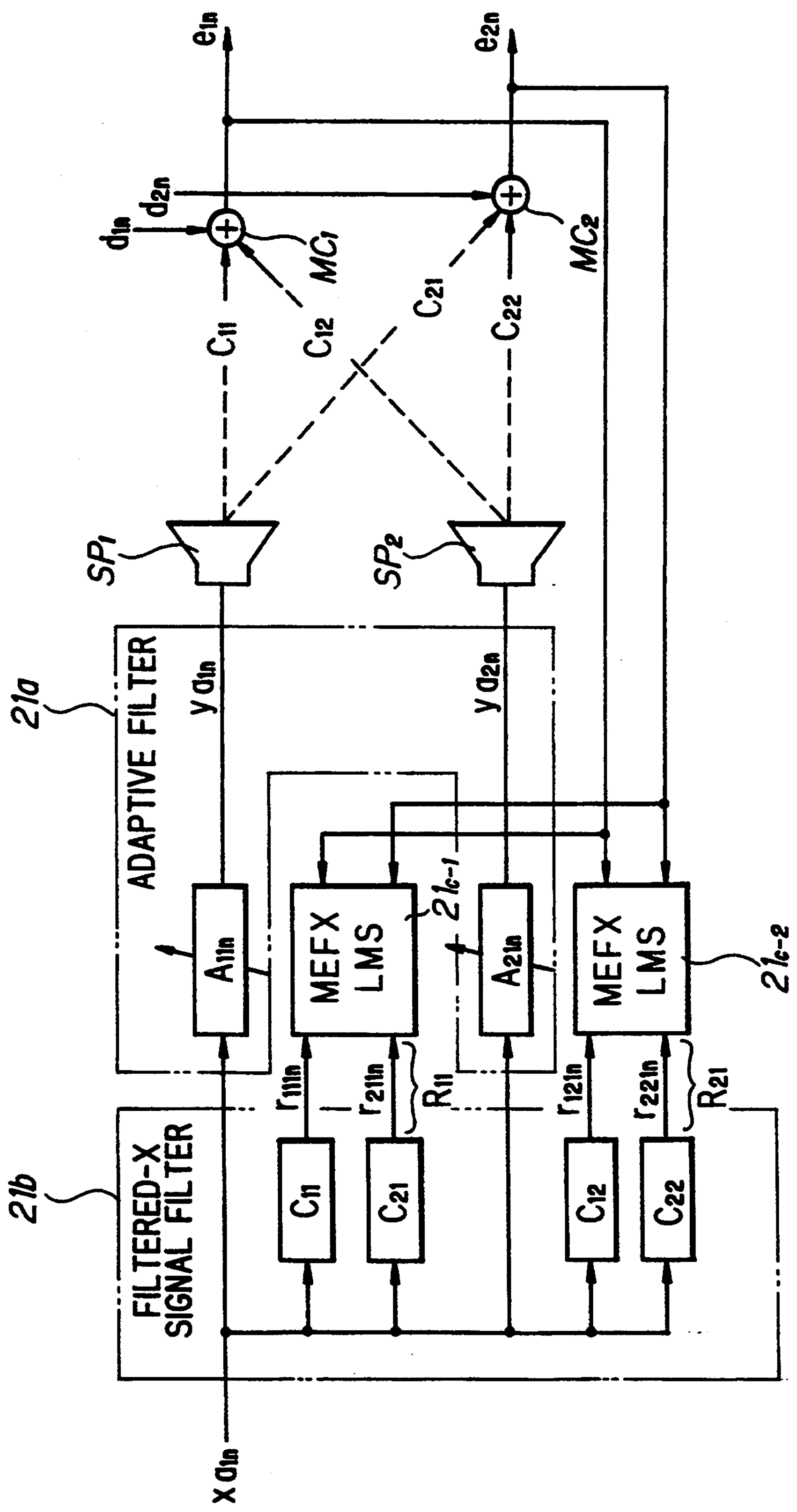
FIG. 20 (PRIOR ART)
FIG. 20 shows the structure of a conventional noise-canceling apparatus in which one noise source, two speakers, and two observation points exist.
Figure 21:
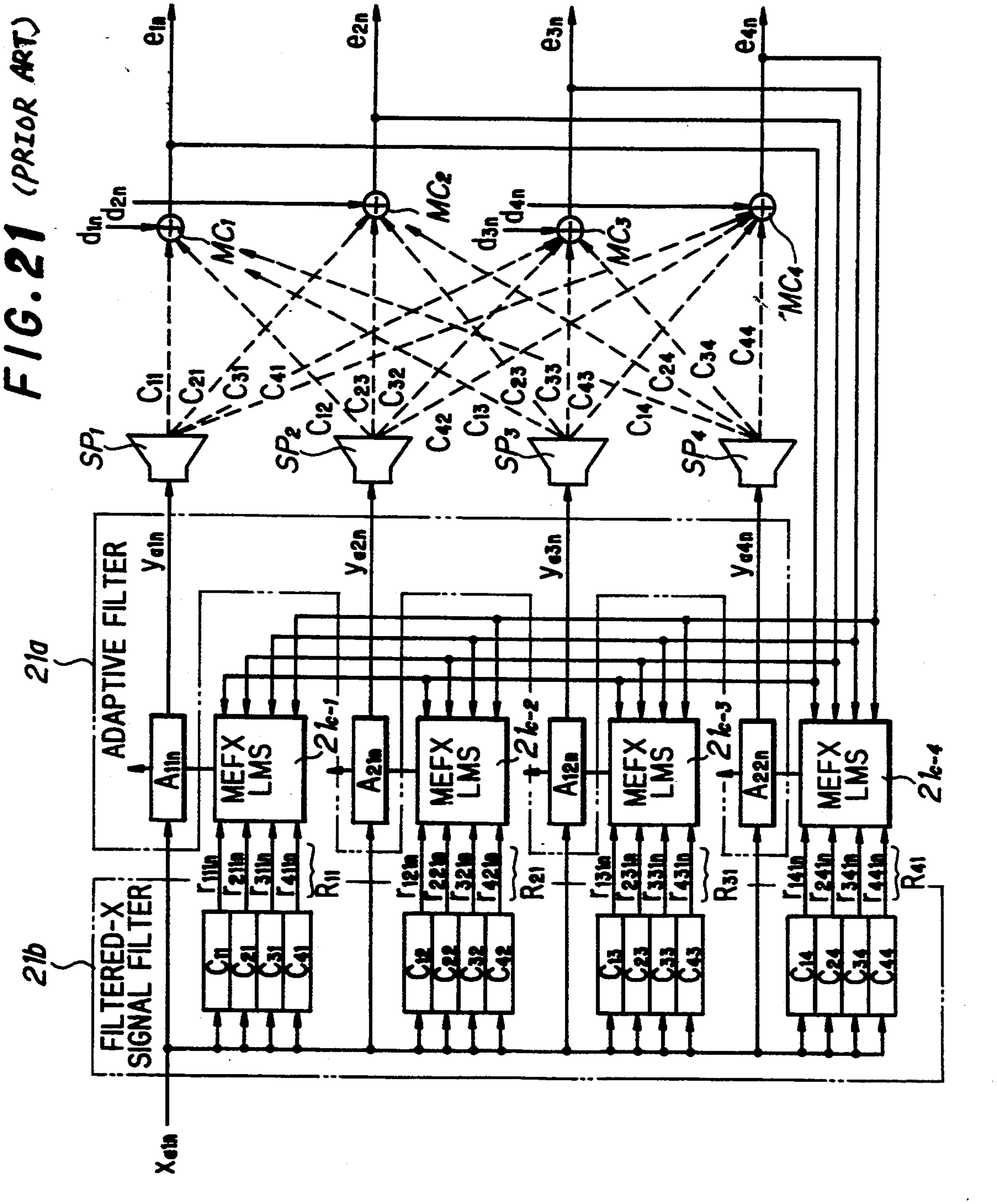
FIG. 21 (PRIOR ART)
FIG. 21 shows the structure of a conventional noise-canceling apparatus in which one noise source, four speakers, and four observation points exist.

The noise-canceling processor 34-1 for a second harmonic is composed of an adaptive signal processor **34*a*, an adaptive filter 34*b* constructed as a digital filter and a filter 34*c* which produces a filtered-X signal $r_n$ on the basis of the transfer function of the cancel-sound propagation system (secondary-sound propagation system) extending from the speaker to the noise-canceling point and to which the reference signal $x_{2n}$ is input. The adaptive filter 34*b* and the filtered-X signal producing filter 34*c* have the structures shown in FIGS. 19 and 18**, respectively.

The error signal $e_n$ at the observation point and the filtered-X signal $r_n$ output from the filter **34*c* are input to the adaptive signal processor 34*a*. The adaptive signal processor 34*a* executes an adaptive signal processing in accordance with the above-described coefficient updating equation (1) on the basis of these signals $e_n$ and $r_n$ and the step-size parameter $\mu$ so as to decide the coefficient of the adaptive filter 34*b***. The coefficient updating equation (1) does not incorporate the output limiting term for limiting the amplitude of the output signal $N_{c2}$.

The adaptive filter **34*b* subjects the reference signal $x_{2n}$ to a digital filtering processing in accordance with the coefficient decided by the adaptive signal processor 34*a*** and outputs the signal $N_{c2}$.

Noise-canceling processors for the other harmonics

Figure 5A:
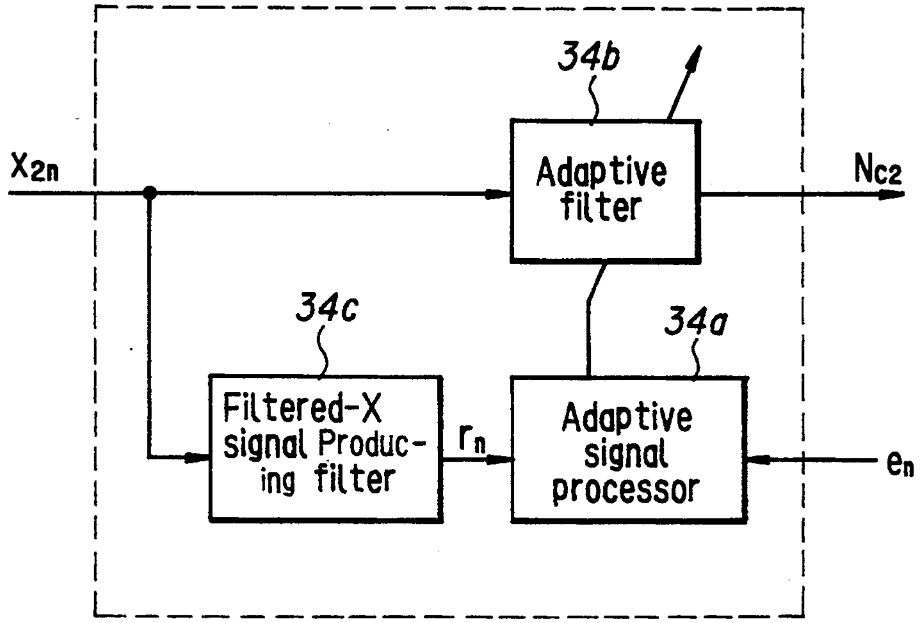
FIGS. 5A and 5B show the structures of each noise-canceling processor in the second embodiment shown in FIG. 4.

Each of the noise-canceling processors 34-2, 34-3 for the harmonics other than a second harmonic is composed of an adaptive signal processor **34*a*', an adaptive filter 34*b*' constructed as a digital filter and a filter 34*c*' which produces a filtered-X signal $r_n'$ on the basis of the transfer function of the cancel-sound propagation system (secondary-sound propagation system) extending from the speaker to the noise-canceling point and to which the reference signal $x_{4n}$ ($x_{6n}$) is input. The adaptive filter 34*b*' and the filtered-X signal producing filter 34*c*' have the same structures as the adaptive filter 34*b* and the filtered-X signal producing filter 34*c*, respectively, shown in FIG. 5A**.

The error signal $e_n$ at the observation point, the output signal $N_{c4}$ ($N_{c6}$) and the filtered-X signal $r_n'$ output from the filter **34*c*'** are input to the adaptive signal processor 34a'. The adaptive signal processor 34a' executes an adaptive signal processing in accordance with a later-described coefficient updating equation (4) on the basis of these signals and the step-size parameter $\mu$ so as to decide the coefficient of the adaptive filter 34b'. The adaptive filter 34b' subjects the reference signal $x_{4n}$ ($x_{6n}$) to a digital filtering processing in accordance with the coefficient decided by the adaptive signal processor 34a' and outputs the signal $N_{c4}$ ($N_{c6}$).

The adaptive signal processor 34a' decides the coefficient of the adaptive filter 34b' in the following manner. When each of the FIR-type digital filters $A_{11n}$–$A_{MKn}$ (see FIG. 19) in the adaptive filter 34b' is composed of three coefficients $a_0$, $a_1$ and $a_2$ (two delay stages), the adaptive signal processor 34a' decides the values of the coefficients $a_0$, $a_1$ and $a_2$ by executing an adaptive signal processing for each of the FIR-type digital filters $A_{11n}$–$AMK_n$ from the calculation of the following coefficient updating equation (4):

$$\begin{pmatrix} a_0(n+1) \\ a_1(n+1) \\ a_2(n+1) \end{pmatrix} = \begin{pmatrix} a_0(n) \\ a_1(n) \\ a_2(n) \end{pmatrix} - \mu \left\{ \beta y_{ain} \begin{pmatrix} X_{ajn}(n) \\ X_{ajn}(n-1) \\ X_{ajn}(n-2) \end{pmatrix} + \begin{pmatrix} R_{ij}(n) \\ R_{ij}(n-1) \\ R_{ij}(n-2) \end{pmatrix} e_n \right\} \quad (4)$$

In the equation (4), the symbol (n) signifies the value at the present sampling time, (n−1) the value at the preceding sampling time, (n−2) the value at the time two samplings before the present sampling time, and (n+1) the value from the present time to the next sampling time. Accordingly, $X_{ajn}(n-2)$ signifies the reference signal at the time two samplings before the present sampling time, $X_{ajn(n-1)}$ signifies the reference signal at the preceding sampling time, and $X_{ajn}(n)$ signifies the reference signal at the present time. The symbol $R_{ij}(n-2)$ signifies the output of the filter 34c' that conforms to the reference signal $X_{ajn}(n-2)$ at the time two samplings before the present sampling time; $R_{ij}(n-1)$ signifies the output of the filter 34c' that conforms to the reference signal $X_{ajn(n-1)}$ at the preceding sampling time; and $R_{ij}(n)$ signifies the output of the filter 34c' that conforms to the reference signal $X_{ajn}(n)$ at the present time. The symbol $e_n$ represents the composite-sound signal of the noise and the noise-canceling sound at each of the L-number of observation points and is represented as follows:

$$R_{ij} = (r_{1ijn}, r_{2ijn}, \ldots r_{Lijn})$$

$$R_{ij(n)} = (C_{1j}, C_{2j}, C_{3j}, \ldots, C_{Lj}) X_{ajn}(n)$$

$$R_{ij(n-1)} = (C_{1j}, C_{2j}, C_{3j}, \ldots, C_{Lj}) X_{ajn}(n-1)$$

$$R_{ij(n-2)} = (C_{1j}, C_{2j}, C_{3j}, \ldots, C_{Lj}) X_{ajn}(n-2)$$

-continued $$e_n = \begin{pmatrix} e_{1n} \\ e_{2n} \\ \cdot \\ \cdot \\ \cdot \\ e_{Ln} \end{pmatrix}$$

Figure 5B:
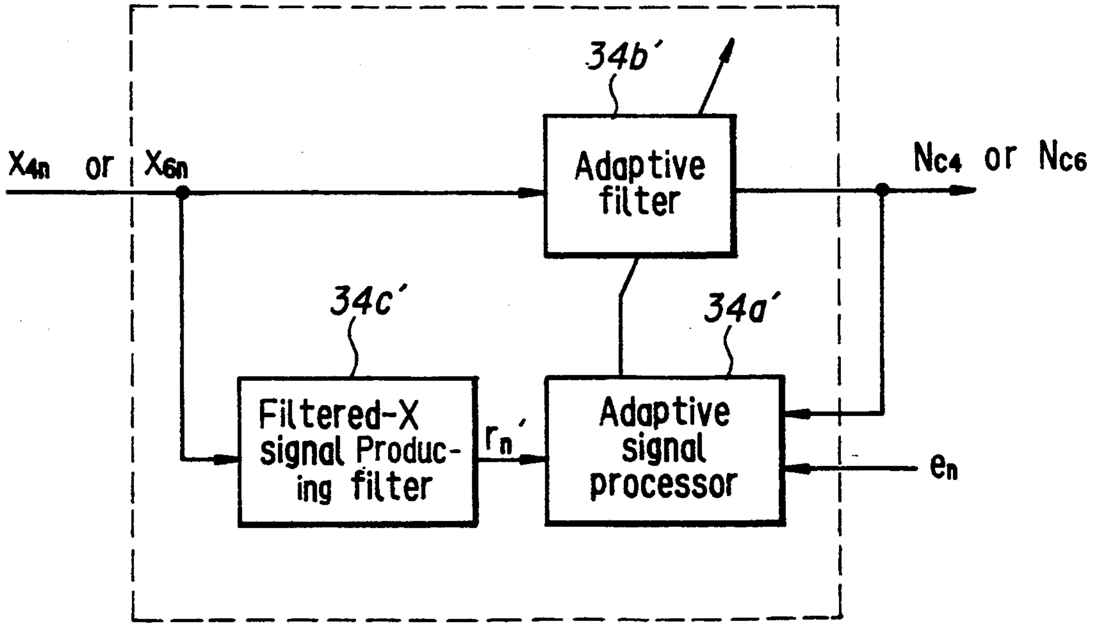

In the coefficient updating equation (4), the term:

$$\mu \beta y_{ain} \begin{pmatrix} X_{ajn}(n) \\ X_{ajn}(n-1) \\ X_{ajn}(n-2) \end{pmatrix}$$

on the right side is an output limiting term for limiting the value of the output $Y_{ain}$ of the adaptive filter 34b' (which corresponds to $N_{c4}$, $N_{c6}$ in FIGS. 4 and 5) so as to prevent the output $Y_{ain}$ from becoming to large. The symbol $\beta$ represents an output limiting parameter not more than 1 and is set to an appropriate value in advance.

In the coefficient updating equation (4), the term:

$$\mu \begin{pmatrix} R_{ij}(n) \\ R_{ij}(n-1) \\ R_{ij}(n-2) \end{pmatrix} e_n$$

on the right side decides the direction of update and the updating step of the adaptive filter 34b' in accordance with the value and the sign of the composite-sound signal (error signal) $e_n$, and influences the followability and the stability in the same way as in the equation (1).

Entire operation

When the engine 31 rotates, its rotational speed R is detected by the rotational speed sensor 32 and input to the reference signal generator 33. The reference signal generator 33 generates the reference signals $x_{2n}$, $x_{4n}$ and $x_{6n}$ of a second harmonic, a fourth harmonic and a sixth harmonic, respectively, whose frequencies conform to the engine rotational speed R. The reference signals $x_{2n}$, $x_{4n}$ and $x_{6n}$ are input to the noise-canceling controller 34. At this time the periodic engine noise (containing second, fourth and sixth harmonic components) generated by the engine 31 reaches the noise-canceling point upon propagating through space having a noise propagation system (a primary-noise propagation system) that exhibits a predetermined transfer function.

The error microphone 38 detects the composite sound of the noise at the noise-canceling point and the noise-canceling sound, and inputs the composite-sound signal (error signal) $e_n$ to the adaptive signal processors 34a, 34a' and 34a' (FIG. 5) of the noise-canceling processors 34-1, 34-2 and 34-3, respectively, through the AD converter 41.

The reference signals $x_{2n}$, $x_{4n}$ and $x_{6n}$ are input to the filters 34c, 34c' and 34c' of the noise-canceling processors 34-1, ]4-2 and 34-3, respectively, and the filters 34c, 34c' and 34c' input the filtered-X signals $r_n$, $r_n'$ and $r_n'$ which are used for an LMS adaptive signal processing to the adaptive signal processors 34a, 34a' and 34a' (FIG. 5), respectively.

The adaptive signal processor 34a of the noise-canceling processor 34-1 for a second harmonic executes an adaptive signal processing in accordance with the above-described coefficient updating equation (1) on the basis of the filtered-X signals $r_n$ and the step-size parameter $\mu$ so as to decide the coefficient of the adaptive filter 34b. The adaptive filter 34b subjects the reference signal $x_{2n}$ to a digital filtering processing in accordance with the coefficient decided by the adaptive signal processor 34a and outputs the noise-canceling signal $N_{c2}$.

Each of the adaptive signal processors 34a' of the noise-canceling processors 34-2, 34-3 for a fourth harmonic and a sixth harmonic, respectively, executes an adaptive signal processing in accordance with the coefficient updating equation (4) on the basis of the error signal $e_n$, the filtered-X signal $r_n'$ which is output from the filtered-X signal producing filter 34c' and the step-size parameter $\mu$ so as to decide the coefficient of the adaptive filter 34b'. The adaptive filter 34b' subjects the reference signal $x_{4n}$ ($x_{6n}$) to a digital filtering processing in accordance with the coefficient decided by the adaptive signal processor 34a' and outputs the noise-canceling signal $N_{c4}$ ($N_{c6}$).

The adders 34-4 and 34-5 add the outputs $N_{c2}$, $N_{c4}$ and $N_{c6}$ of the noise-canceling processors 34-1, 34-2 and 34-3, respectively, to generate the noise-canceling signal $N_c$ and inputs the signal $N_c$ into the DA converter 35. The DA converter 35 converts the noise-canceling signal $N_c$ into an analog noise-canceling signal $N_{cA}$ and inputs it into the noise-canceling speaker 37 through the power amplifier 36. In this way, the noise-canceling speaker 37 emits the noise-canceling sound $S_c$ so that the noise-canceling sound $S_c$ reaches the noise-canceling point through a secondary-sound propagation system 42 and cancels the second, fourth and sixth harmonic components contained in the engine noise. This cycle of noise-canceling processing is repeated and the noise is canceled quickly.

According to the second embodiment, since the noise-canceling processor for a predetermined harmonic (e.g., second harmonic) decides the coefficient of the adaptive filter in accordance with the coefficient updating equation (1) which does not incorporate an output limiting term, and the adaptive filter subjects the reference signal to a digital filtering processing so as to output a noise-canceling signal, it is possible to cancel the predetermined second harmonic component while satisfying both the followability and the stability.

With regard to the other harmonics (for example, fourth and sixth harmonics), since the coefficients of the adaptive filters are decided in accordance with the coefficient updating equation (4) which incorporates an output limiting term, and the adaptive filters subject the reference signals of the fourth and sixth harmonics to a digital filtering processing to output noise-canceling signals, it is possible to decide the coefficients of the adaptive filters such that if the output of the adaptive filter becomes too large, the output is limited to that degree, thereby preventing the canceling-sound signals for the harmonic components other than the second harmonic component from becoming too large. In other words, the problem of the noise increasing phenomenon is solved.

(c) Third Embodiment

Entire structure

Figure 6:
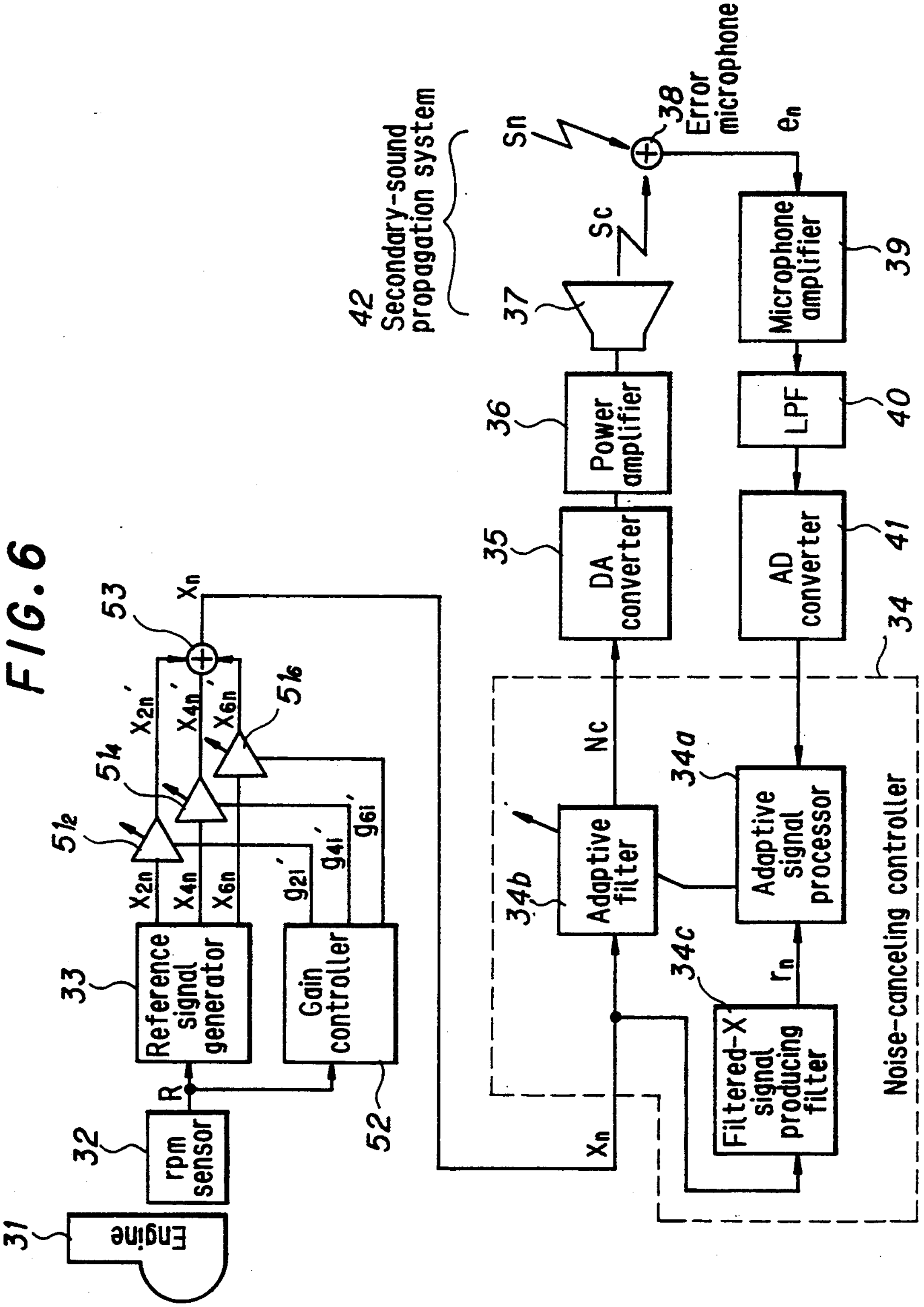
FIG. 6 shows the structure of a third embodiment of a noise-canceling method according to the present invention.

FIG. 6 shows the structure of a third embodiment of a noise-canceling method according to the present invention.

In FIG. 6, the reference numeral 31 represents an engine as a noise source; 32 a rotational speed sensor for detecting the engine rotational speed R (rps); and 33 a reference signal generator for outputting sinusoidal signals of a second harmonic, a fourth harmonic and a sixth harmonic as reference signals $x_{2n}$, $x_{4n}$ and $x_{6n}$, respectively, in correspondence with the engine rotational speed R. The reference numerals 51$_2$, 51$_4$ and 51$_6$ represent variable-gain amplifiers; 52 a gain controller for controlling the gains of amplifiers 51$_2$, 5$_{14}$ and 5$_{16}$ so as to control the amplitudes of the reference signals $x_{2n}$, $x_{4n}$ and $x_{6n}$ of the second harmonic, the fourth harmonic and the sixth harmonic, respectively; and 53 an adder for adding the outputs of the amplifiers 51$_2$, 51$_4$ and 51$_6$ and inputting the sum to the noise-canceling controller at the next stage as the reference signal $x_n$.

The reference numeral 34 represents a noise-canceling controller having a DSP structure for executing an adaptive signal processing so as to cancel the engine noise at the noise-canceling point (observation point) within the passenger compartment. The noise-canceling controller 34 receives the reference signal $x_n$ which is output from the adder 53, and the composite-sound signal (error signal) $e_n$ of the noise $S_n$ and the noise-canceling sound $S_c$ at the noise-canceling point in the passenger compartment; executes adaptive signal processings so that the error signal $e_n$ is the minimum; and outputs the noise-canceling signal $N_c$.

The noise-canceling controller 34 is provided with an adaptive signal processor 34a, an adaptive filter 34b constructed as a digital filter, and a filtered-X signal producing filter 34c which produces a filtered-X signal on the basis of the transfer function of the cancel-sound propagation system (secondary-sound propagation system) and to which the reference signal $x_n$ is input.

The reference numeral 35 denotes a DA converter for converting the output (noise-canceling signal $N_c$) of the adaptive filter 34b into an analog noise-canceling signal; 36 a power amplifier for amplifying the noise-canceling signal, 37 a noise-canceling speaker for emitting a noise-canceling sound Sc, 38 an error microphone disposed at the noise-canceling point so as to detect the composite sound of the noise $S_n$ and the noise-canceling sound $S_c$ and output a composite-sound signal as the error signal $e_n$, 39 a microphone amplifier for amplifying the error signal $e_n$, 40 a low-pass filter for eliminating noise signals outside the band of periodic noise and 41 an AD converter for converting the output of the low-pass filter into digital data and inputting the digital data into the noise-canceling controller 34 having a DSP Structure.

Gain controller

Figure 22:
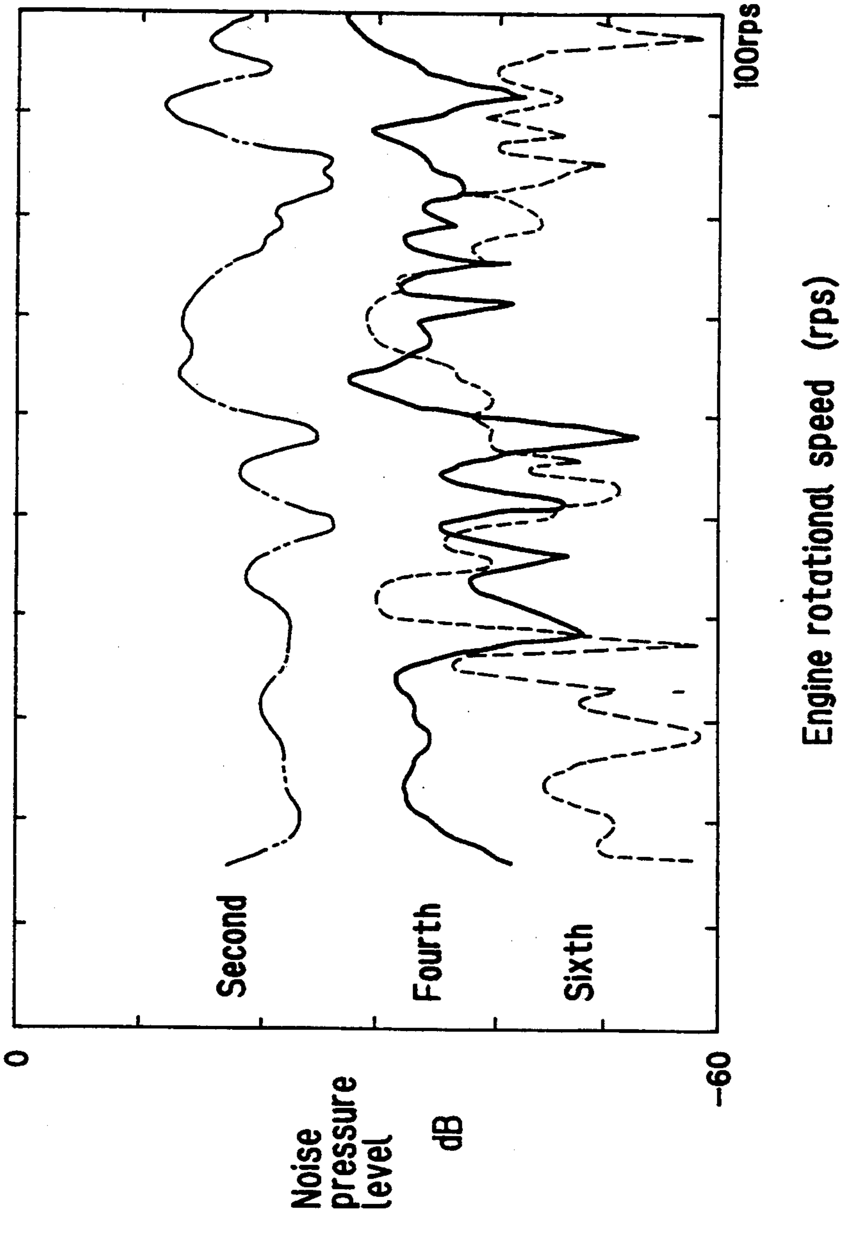
FIG. 22 is an explanatory view of the harmonic components contained in the engine noise.
Figure 23:
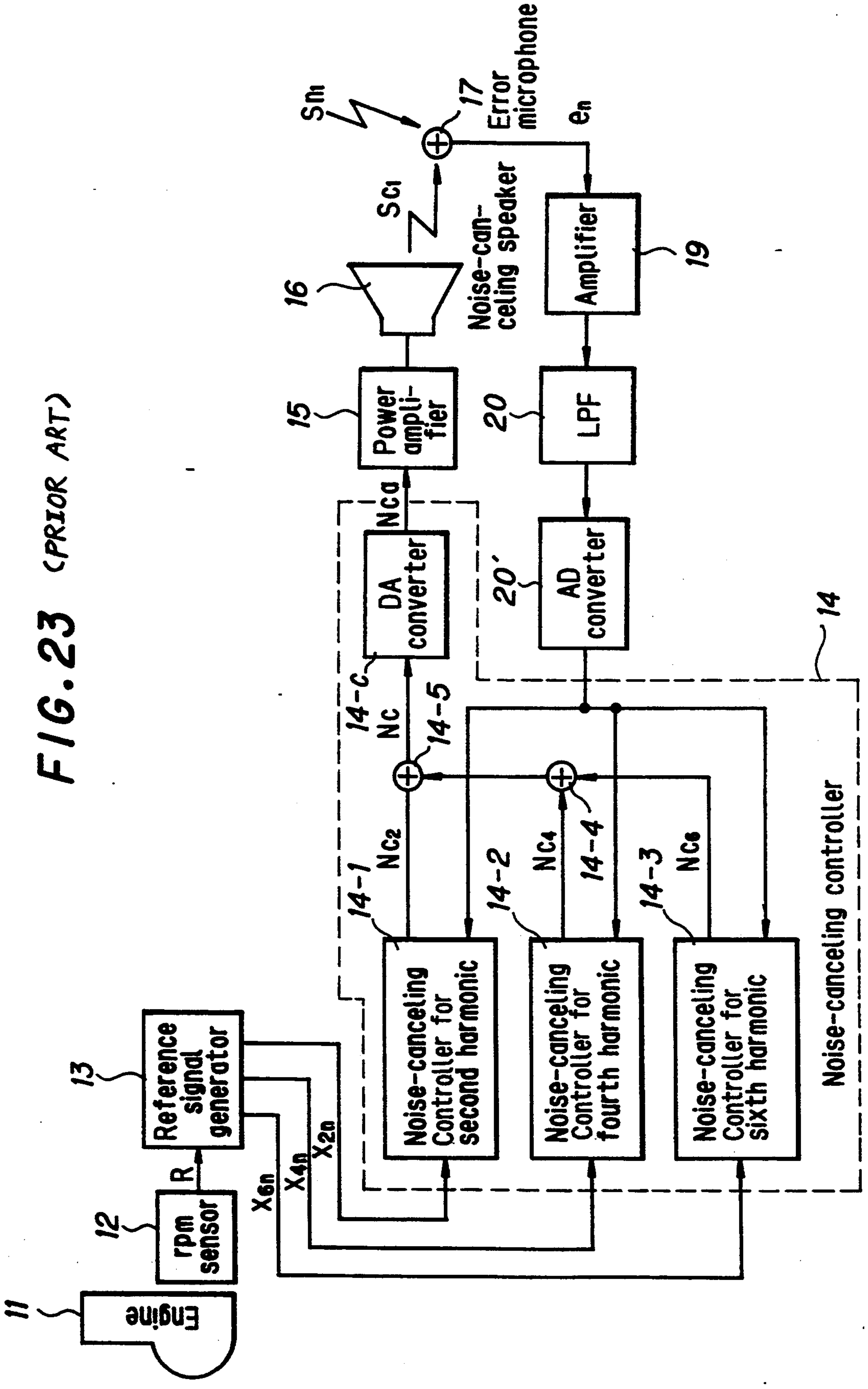
FIG. 23 (PRIOR ART)
FIG. 23 shows the structure of a conventional noise-canceling apparatus for canceling each harmonic component contained in the engine noise.

The gain controller 52 controls the gains of the amplifiers 51$_2$, 51$_4$ and 51$_6$ in accordance with the engine rotational speed R so that the lower the level of the harmonic component is, the larger the amplitude of the reference signal corresponding to the harmonic component becomes. The second, fourth and sixth harmonic components contained in the engine noise have levels shown in FIG. 22, and they are approximated to straight lines in FIG. 7. If it is assumed that the gains necessary for raising the levels of the fourth and the sixth harmonic components to the highest level (the level of the second harmonic component) or a level (indicated by a broken line) close to the highest level are $g_{4i}$ and $g_{6i}$, the gain controller 52 sets the gain of the amplifier $51_2$ to $g_{2i}$ (=1), the gain of the amplifier $51_4$ to $g_{4i}$, and the gain of the amplifier $51_6$ to $g_{6i}$. In this way, the lower the level of the harmonic component is, the larger the amplitude of the reference signal corresponding to the harmonic component becomes.

Figure 7:
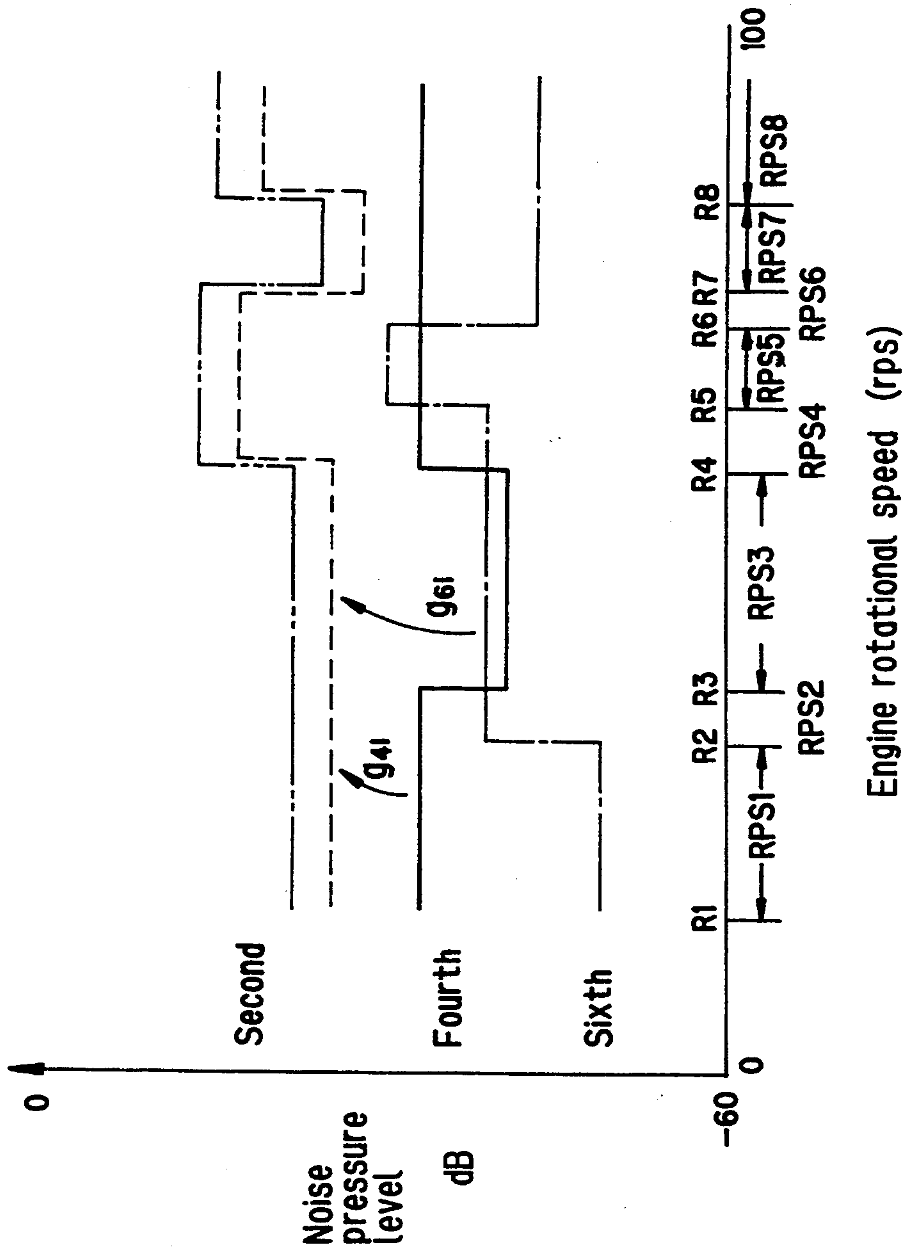
FIG. 7 is an explanatory view of the harmonic components contained in the engine noise whose levels are approximated to straight lines.

Actually, since each harmonic component changes in accordance with the engine rotational speed R, as shown in FIG. 7, the gains $g_{2i}$, $g_{4i}$ and $g_{6i}$ (i=1, 2, . . . 8) which are necessary for raising the levels of the other harmonic components to the highest level or a level closer thereto are obtained in advance for each of the rotational speed ranges $RPS_1$ to RPS8, and the gains obtained are stored in the memory within the gain controller 52. FIG. 8 shows an example of the gains stored in the memory. When the engine rotates, the gains $g_{2i}$, $g_{4i}$ and $g_{6i}$ corresponding to the engine rotational speed R are read out of the memory and set in the respective amplifiers $51_2$, $51_4$ and $51_6$.

Adaptive signal processor

The error signal $e_n$ at the observation point and the filtered-X signal $r_n$ are input to the adaptive signal processor 34*a*, and the adaptive signal processor 34*a* decides the coefficient of the adaptive filter 34*b* by an adaptive signal processing based on these signals and the step-size parameter $\mu$ in accordance with the equation (1). The adaptive filter 34*b* subjects the reference signal $x_n$ output from the adder 53 to a digital filtering processing in accordance with the coefficient decided by the adaptive signal processor 34*a* and outputs an analog noise-canceling signal from the DA converter 35.

Entire operation

When the engine 31 rotates, its rotational speed R is detected by the rotational speed sensor 32 and input to the reference signal generator 33. The reference signal generator 33 generates the reference signals $x_{2n}$, $x_{4n}$ and $x_{n6}$ of a second harmonic, a fourth harmonic and a sixth harmonic, respectively, whose frequencies conform to the engine rotational speed R.

The gain controller 52 reads the gains $g_{2i}$, $g_{4i}$ and $g_{6i}$ which conform to the engine rotational speed R out of the memory and set them in the respective amplifiers $51_2$, $51_4$ and $51_6$. The amplifiers $51_2$, $51_4$ and $51_6$ amplify the reference signals $x_{2n}$, $x_{4n}$ and $x_{6n}$ which are input thereto by the set gains, and output signals $x_{2n}'$, $x_{4n}'$, and $x_{6n}'$ The lower the level of the harmonic component (second, fourth or sixth) contained in the engine noise is, the larger the amplitude of the reference signal $x_{2n}'$, $x_{4n}'$ and or $x_{6n}'$ corresponding to the harmonic component becomes The adder 53 adds the outputs $x_{2n}'$, $x_{4n}'$ and $x_{6n}'$ of the amplifiers $51_2$, $51_4$ and $51_6$ and inputs the reference signal $x_n$ to the noise-canceling controller 34. The signals $x_{2n}'$, $x_4'$ and $x_6'$ are also referred to as the reference signal components of the second, fourth and sixth harmonics, respectively.

During these processings, the periodic engine noise (periodic noise) generated by the engine 31 reaches the noise-canceling point upon propagating through space having a noise propagation system (a primary-noise propagation system) that exhibits a predetermined transfer function, and the error microphone 38 detects the composite sound of the noise at the noise-canceling point and the noise-canceling sound as the error signal $e_n$, and inputs the error signal $e_n$ to the noise-canceling controller 34 through the microphone amplifier 39, the low-pass filter 40 and the AD converter 41.

When the reference signal $x_n$ is input to the filtered-X signal producing filter 34*c* of the noise-canceling controller 34, the filter 34*c* produces the reference signal (filtered-X signal) $r_n$ which is used for an LMS adaptive signal processing and inputs it to the adaptive signal processor 34*a*. The adaptive signal processor 34*a* executes the LMS adaptive signal processing in accordance with the equation (1) on the basis of the error signal $e_n$ and the filtered-X signal $r_n$ so as to decide the coefficient of the adaptive filter 34*b*.

The adaptive filter 34*b* subjects the reference signal $x_n$ to a digital filtering processing in accordance with the coefficient decided by the adaptive signal processor 34*a* and inputs the signal $N_c$ to the DA converter 35. The DA converter 35 converts the noise-canceling signal $N_c$ into an analog noise-canceling signal and inputs it into the speaker 37 through the power amplifier 36. In this way, the speaker 37 emits the noise-canceling sound so that the noise-canceling sound reaches the noise-canceling point through a secondary-sound propagation system 42 and cancels the noise. This cycle of noise-canceling processing is repeated and the noise is canceled quickly.

In this embodiment, the lower the level of the harmonic component contained in the engine noise is, the larger the amplitude of the reference signal component corresponding to the harmonic component becomes. Therefore, in the coefficient updating equation (1), a signal is processed as if the step-size parameters of the harmonic components of a low level became equivalently large. As a result, the amount of harmonic components of a low level canceled increases, and the engine noise is canceled with a good followability. In the case of deciding the gains $g_{4i}$ and $g_{6i}$ so that the levels of the harmonic components agree with the highest level (see FIG. 7), all the harmonic components are approximately equally canceled. If the gains $g_{4i}$ and $g_{6i}$ are decided so that the levels of the harmonic components approach the highest level (see FIG. 7) even if they cannot reach it, it is possible to maximize the amount of the harmonic component of the highest level canceled while making the amount of harmonic components of a low level large enough not to be offensive to the ear.

According to the third embodiment, the reference signals corresponding to the harmonic components of a level higher than 2 among the harmonic components of the engine rotational speed contained in the engine noise are produced, and the lower the level of the harmonic component is, the larger is made the amplitude of the reference signal component corresponding to the harmonic component. The reference signals corresponding to the respective harmonic components are added and the composite signal is used as the reference signal for the adaptive signal processing. Since the engine noise at the noise-canceling point is canceled by using the reference signal and the composite-sound signal as if the step-size parameters of the harmonic components of a low level became equivalently large, the amount of harmonic components of a low level canceled increases and the engine noise is canceled with a good followability, so that the harmonic components of a lower level are not offensive to the ear.

In addition, according to the third embodiment, since the levels of the reference signals corresponding to the respective harmonic components are controlled in accordance with the engine rotational speed, it is possible to increase the amount of harmonic components of a low level canceled at every engine rotational speed, and it is possible to cancel the noise with a good followability.

(d) Fourth Embodiment

Figure 9:
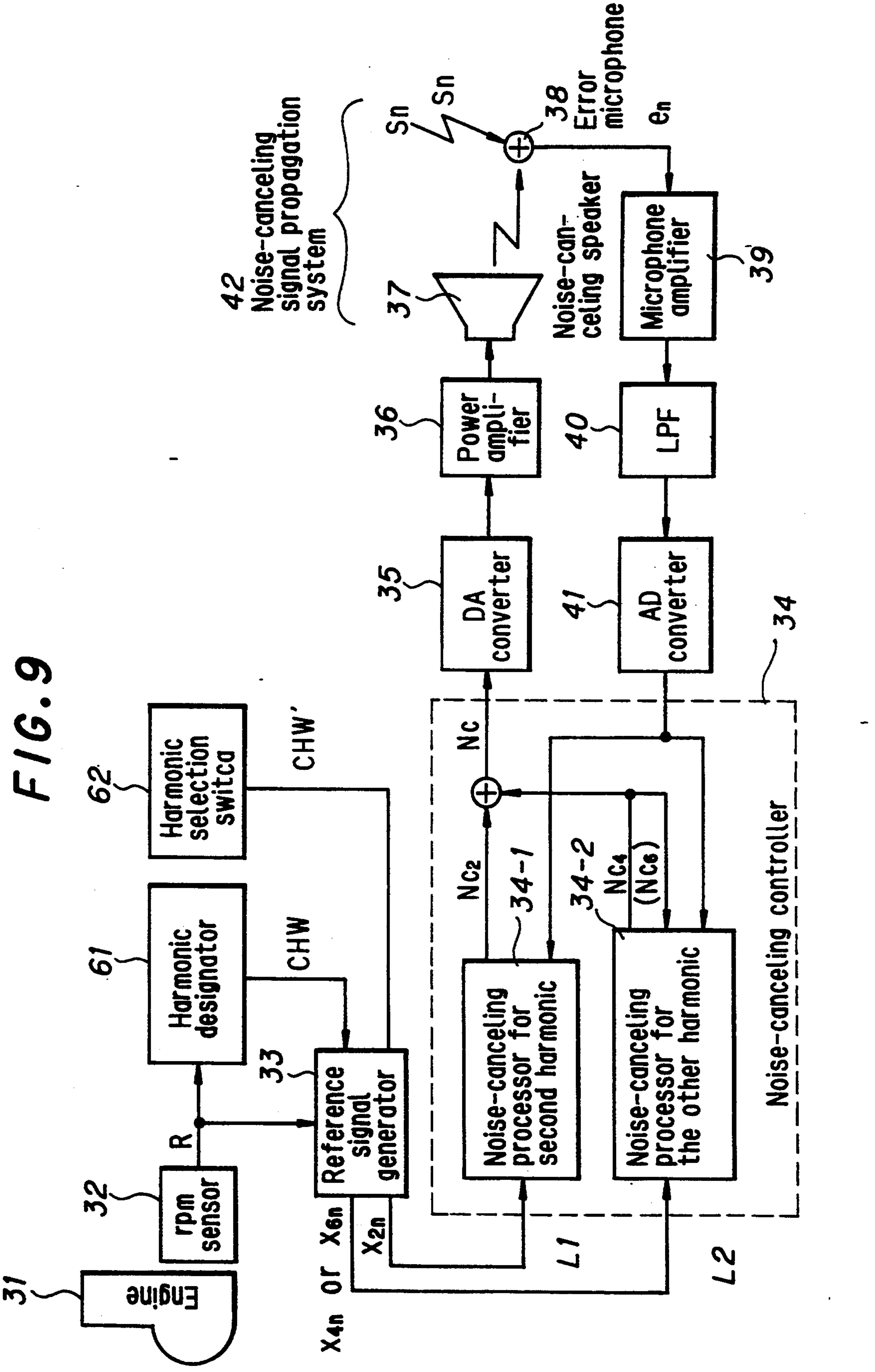
FIG. 9 shows the structure of a fourth embodiment of a noise-canceling method according to the present invention.

FIG. 9 shows the structure of a fourth embodiment of a noise-canceling method according to the present invention. In this embodiment, one engine is used as the noise source, and one speaker and one microphone are provided.

In FIG. 9, the reference numeral 31 represents an engine as a noise source, 32 a rotational speed sensor for detecting the engine rotational speed R (rps) and 33 a reference signal generator. The reference signal generator 33 outputs sinusoidal signals of a second harmonic, a fourth harmonic and a sixth harmonic as reference signals $x_{2n}$, $x_{4n}$ and $x_{6n}$, respectively, in correspondence with the engine rotational speed R. The reference signal $x_{2n}$ of the second harmonic is constantly output to a line L1 irrespective of the rotational speed, while as to the fourth and sixth harmonics, the reference signal $x_{4n}$ or $x_{6n}$ of the harmonic which is designated either on the basis of the engine rotational speed or by a selection switch is output to a line L2.

The reference numeral 61 represents a harmonic designator for designating a harmonic which is to be canceled. The harmonic designator 61 decides a harmonic which is to be canceled on the basis of the engine rotational speed R and inputs the signal to the reference signal generator 33. The reference numeral 62 denotes a harmonic selection switch for designating the ordinal of the harmonic which is to be canceled, 34 a noise-canceling controller, wherein 34-1 a noise-canceling processor (noise-canceling controller) for a second harmonic, 34-2 a noise-canceling processor (noise-canceling controller) for harmonics other than the second harmonic, and 34-4 an adder for adding the outputs $N_{c2}$ and $N_{c4}$ or $N_{c6}$ of the noise-canceling processors 34-1, 34-2, and outputting the sum as a noise-canceling signal $N_c$. The reference numeral 35 denotes a DA converter for converting the noise-canceling signal $N_c$ into an analog noise-canceling signal; 36 a power amplifier for amplifying the noise-canceling signal; 37 a noise-canceling speaker to which a noise-canceling signal $N_c$ is input so as to emit a noise-canceling sound $S_c$; 38 an error microphone disposed at the noise-canceling point so as to detect the composite sound of the noise $S_n$ and the noise-canceling sound $S_c$ and output a composite-sound signal as the error signal $e_n$; 39 a microphone amplifier; 40 a low-pass filter; 41 an AD converter for converting error signal $e_n$ into a digital signal; 42 a canceling-sound propagation system (secondary-sound and propagation system) along which the canceling sound is propagated from the speaker to the noise-canceling point.

Harmonic designator

Figures 10A, 10B:
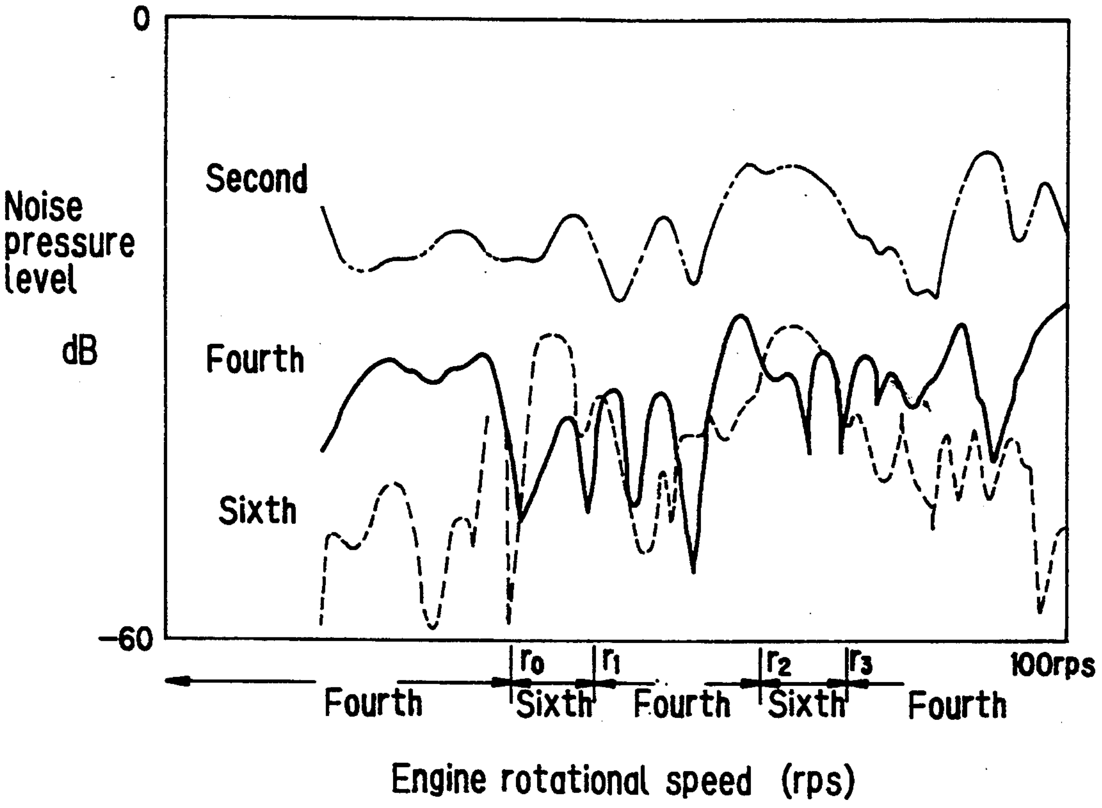
FIGS. 10A and 10B explain the relationship between the engine rotational speed and a harmonic component which is to be canceled.

The harmonic designator 61 determines the harmonic which is to be canceled on the basis of the engine rotational speed and inputs the signal to the reference signal generator 33. As shown in FIG. 10(*a*), the engine noise includes harmonic components (for example, second, fourth, sixth harmonic components) of the engine rotational speed. The second harmonic component, which has the highest level, is dominant in the engine noise. In addition, either of the levels of the fourth and sixth harmonic components becomes larger in correspondence with the engine rotational speed. In other words, when the engine rotational speed is in the range of 0 to $r_0$, $r_1$ to $r_2$, and not less than $r_3$, the fourth harmonic component is larger than the sixth harmonic component, and when the engine rotational speed is in the range of $r_0$ to $r_1$, and $r_2$ to $r_3$, the sixth harmonic component is larger than the fourth harmonic component. The relationship between the engine rotational speed and a harmonic component which is to be canceled shown in FIG. 10(*b*) is therefore stored in the harmonic designator 61, so that the harmonic designator 61 inputs, to the reference signal generator 33, a signal CHW which indicates the harmonic which is to be canceled in correspondence with the engine rotational speed. The second harmonic is canceled irrespective of the engine rotational speed.

However, some passengers want to cancel the second and fourth harmonics of a certain engine rotational speed and the second and sixth harmonics of another engine rotational speed irrespective of the noise level. In such a case, the relationship between the engine rotational speed and the harmonic which is to be canceled is decided on the basis of the auditory sensation of the passenger and stored in the harmonic designator 61.

Harmonic selection switch

The harmonic selection switch 62 designates the harmonic which is to be canceled. The level of the fourth harmonic becomes larger than the level of the sixth harmonic, and vice versa, in correspondence with the type of automotive vehicle. In addition, the harmonics contained in the engine noise are different depending on the type of automotive vehicle. In such cases, the harmonic selection switch 62 designates the combination of the harmonics which are to be canceled, so that the combination of the second and fourth harmonic components, the combination of the second and sixth harmonic components, or other combination of harmonic components is constantly canceled.

Either or both of the harmonic designator 61 and the harmonic selection switch 62 may be provided in this embodiment. When both of them are provided, the harmonic designator 61 and the harmonic selection switch 62 are appropriately changed over to each other for the function of selecting harmonics to be canceled.

Noise-canceling processor for second harmonic

The reference signal $x_{2n}$ of the second harmonic generated from the reference signal generator 33 is input to the noise-canceling processor 34-1 for the second harmonic, and the composite-sound signal of the noise $S_n$ and the noise-canceling sound $S_c$ at the noise-canceling point in the passenger compartment is also input to the noise-canceling processor 34-1 as an error signal $e_n$. The noise-canceling processors 34-1 then executes an adaptive signal processing in accordance with the coefficient updating equation (1) on the basis of the error signal $e_n$, the reference signal $x_{2n}$, and the step-size parameter $\mu$, so that the second harmonic component contained in the error signal $e_n$ at the observation point is the minimum, and outputs the noise-canceling signal $N_{c2}$. The noise-canceling processor 34-1 has the structure shown in FIG. 5A.

Noise-canceling processor for the other harmonics

The reference signal $x_{4n}$ ($x_{6n}$) of the fourth (sixth) harmonic generated from the reference signal generator 33 is input to the noise-canceling processor 34-2 for the fourth (sixth) harmonic, and the composite-sound signal of the noise $S_n$ and the noise-canceling sound $S_c$ at each noise-canceling point in the passenger compartment is also input to the noise-canceling processor 34-2 as an error signal $e_n$. The noise-canceling processors 34-2 then executes an adaptive signal processing on the basis of the error signal $e_n$, the reference signal $x_{4n}$ ($x_{6n}$), the output signal $N_{c4}$ ($N_{c6}$) of the noise-canceling processor 34-2, and the step-size parameter $\mu$, so that the fourth (sixth) harmonic component contained in the error signal $e_n$ at the observation point is the minimum, and outputs the noise-canceling signal $N_{c4}$ ($N_{c6}$). The noise-canceling processor 34-2 has the structure shown in FIG. 5B.

Entire operation

When the engine 31 rotates, its rotational speed R is detected by the rotational speed sensor 32 and input to the reference signal generator 33 and the harmonic designator 61. The harmonic designator 61 decides the harmonic which is to be canceled on the basis of the engine rotational speed and input a signal to the reference signal generator 33.

The reference signal generator 33 inputs the reference signal $x_{2n}$ of the second harmonic to the noise-canceling processor 34-1, generates the reference signal $x_{4n}$ or $x_{6n}$ of the harmonic (fourth or sixth harmonic) which is designated by the harmonic designator 61, and inputs the reference signal to the noise-canceling processor 34-2. At this time, the periodic engine noise (periodic noise) generated by the engine 31 reaches the noise-canceling point upon propagating through space having a noise propagation system (a primary-noise propagation system) that exhibits a predetermined transfer function.

The error microphone 38 detects the composite sound of the noise and the canceling sound at the noise-canceling point, and the composite-sound signal (error signal) $e_n$ is input to the adaptive signal processors 34*a*, 34*a*' of the noise-canceling processors 34-1, 34-2 (FIG. 5) through the AD converter 41. At the same time, the reference signal $x_{2n}$, $x_{4n}$ or $x_{6n}$ is input to the filtered-X signal producing filters 34*c*, 34*c*'. The noise-canceling processors 34-1, 34-2 superimpose the propagation characteristic of the canceling-sound propagation system 42 on each reference signal which is input, produce reference signals $r_n$, $r_n'$ for the adaptive signal processing, and input the reference signals to the adaptive signal processors 34*a*, 34*a*' (FIG. 5).

The adaptive signal processor 34*a* (FIG. 5A) of the noise-canceling processor 34-1 executes an adaptive signal processing in accordance with the equation (1) on the basis of the error signal $e_n$, the reference signal $r_n$ for the adaptive signal processing which is output from the filter 34*c*, and the step-size parameter $\mu$ so as to decide the coefficient of the adaptive filter 34*b*. The adaptive filter 34*b* subjects the reference signal $x_{2n}$ of the second harmonic to a digital filtering processing in accordance with the coefficient decided by the adaptive signal processor 34*a* and outputs the noise-canceling signal $N_{c2}$.

On the other hand, the adaptive signal processor 34*a*' (FIG. 5B) of the noise-canceling processor 34-2 executes an adaptive signal processing in accordance with the equation (4) on the basis of the error signal $e_n$, the reference signal $r_n'$ for the adaptive signal processing which is output from the filter 34*c*', the output signal $N_{c4}$ ($N_{c6}$) of the noise-canceling processor, and the step-size parameter $\mu$ so as to decide the coefficient of the adaptive filter 34*b*'. The adaptive filter 34*b*' subjects the reference signal $x_{n4}$ ($x_{n6}$) of the fourth (sixth) harmonic to a digital filtering processing in accordance with the coefficient decided by the adaptive signal processor 34*a*' and outputs the noise-canceling signal $N_{c4}$ ($N_{c6}$).

The adders 34-4 add the outputs of the noise-canceling processors 34-1, 34-2 and input the noise-canceling signal $N_c$ into the DA converter 35. The DA converter 35 converts the noise-canceling signal $N_c$ into an analog noise-canceling signal and inputs the analog noise-canceling signal into the speaker 37 through the power amplifier 36. In this way, the speaker 37 emits the noise-canceling sound $S_c$ so that the noise-canceling sound $S_c$ reaches the noise-canceling point through a secondary-sound propagation system 42 and cancels the engine noise.

This cycle of noise-canceling processing is repeated and the noise is canceled quickly. In addition, if the engine rotational speed changes, the harmonic designator 61 inputs the order of the harmonic which is to be canceled in correspondence with the engine rotational speed to the reference signal generator 33, and the reference signal generator 33 inputs the reference signal of the harmonic corresponding to the order designated by the harmonic designator 61 to the noise-canceling processor 34-1, 34-2, thereby canceling the noise.

If the harmonic which is to be canceled is designated by the harmonic selection switch 62, the reference signal generator 33 inputs the reference signal of the harmonic designated by the harmonic selection switch 62 to each of the noise-canceling processor 34-1, 34-2, thereby canceling the noise.

(e) Another Structure of Fourth Embodiment

Figure 11:
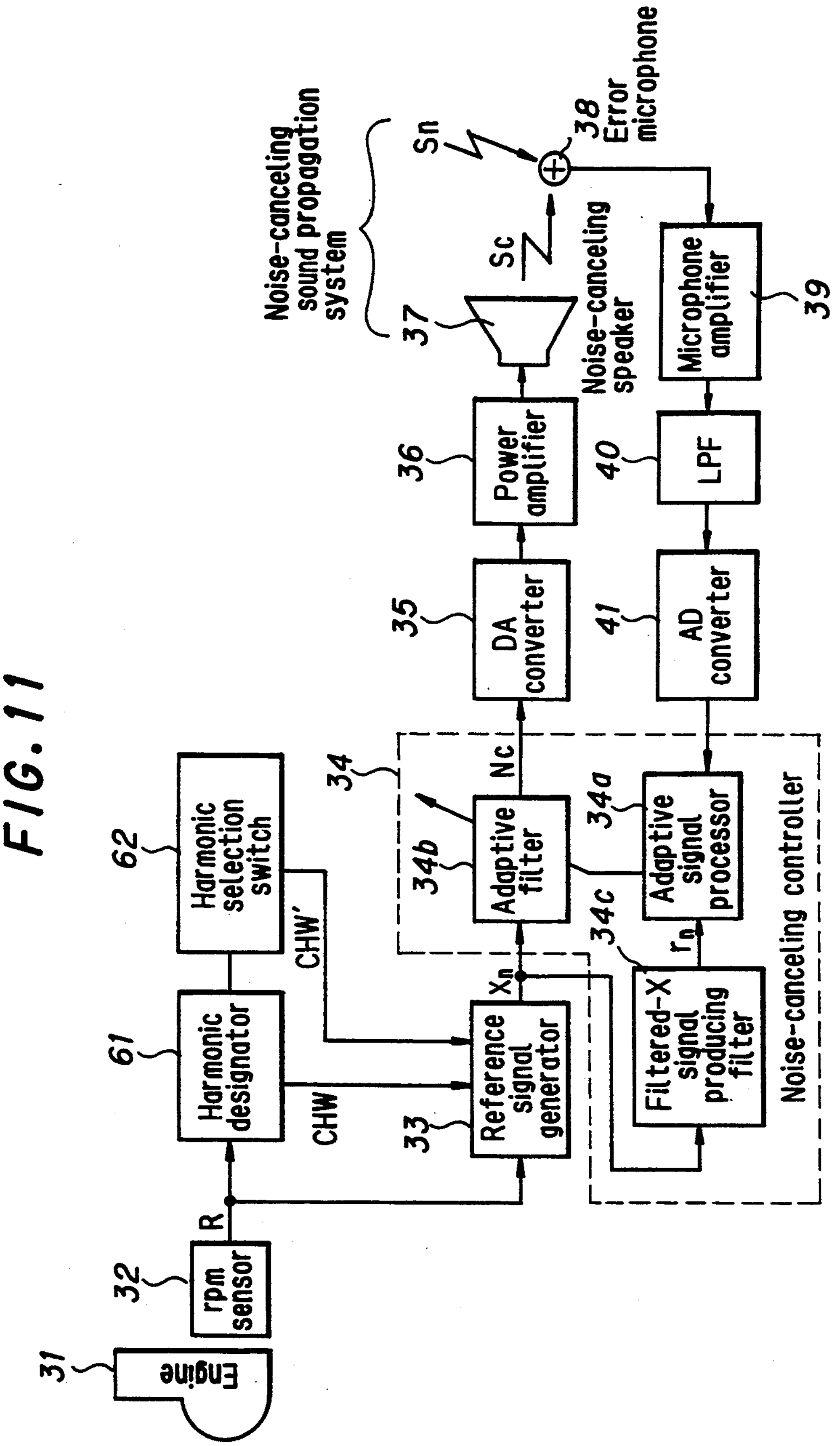
FIG. 11 shows another structure of the fourth embodiment of a noise-canceling method according to the present invention.
Figure 12:
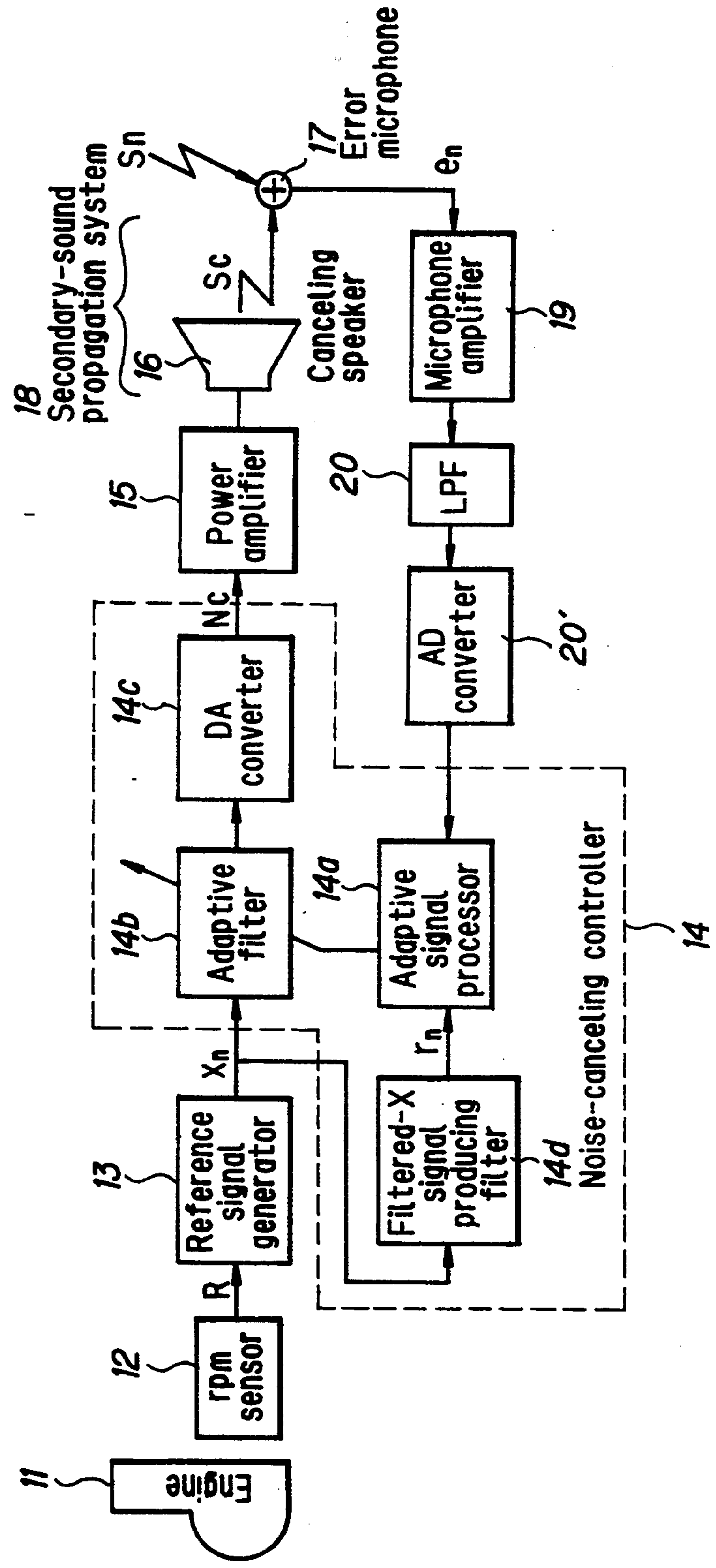
FIG.12 (PRIOR ART)
FIG. 12 shows the structure of a conventional noise-canceling apparatus.
Figure 13:
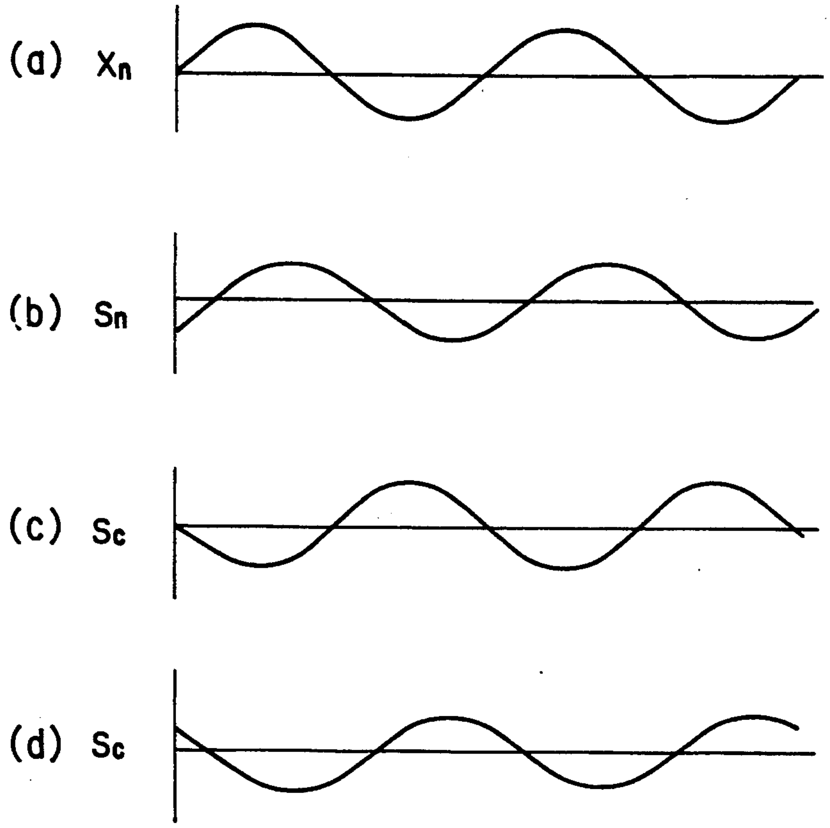
FIG. 13 (PRIOR ART)
FIG. 13 shows the wave forms for explaining the noise-canceling operation.
Figure 14:
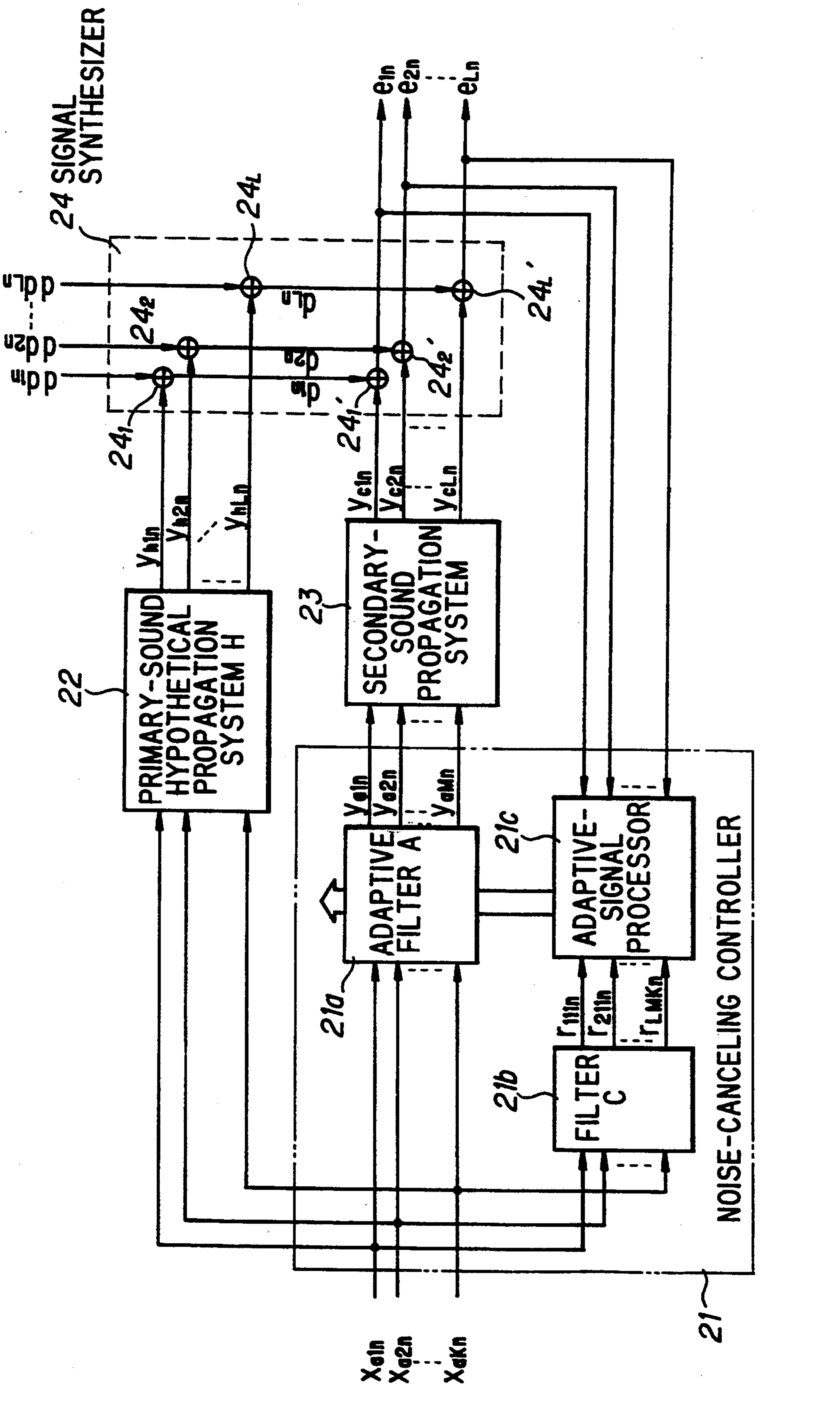
FIG. 14 (PRIOR ART)
FIG. 14 shows the structure of a conventional noise-canceling apparatus in which a plurality of noise sources, speakers and observation points exist.
Figure 15A:
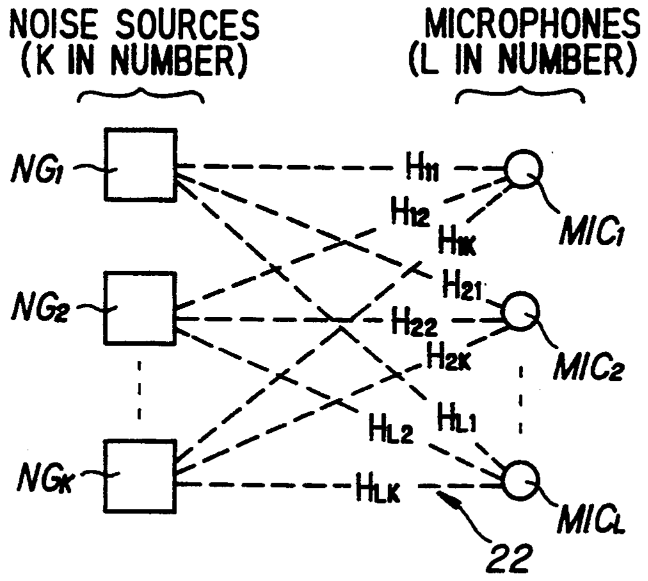
FIG. 15A (PRIOR ART)
FIG. 15A is an explanatory view of a primary-noise hypothetical propagation system and FIG. 15B shows an example of a realized primary-noise hypothetical propagation system.
Figure 15B:
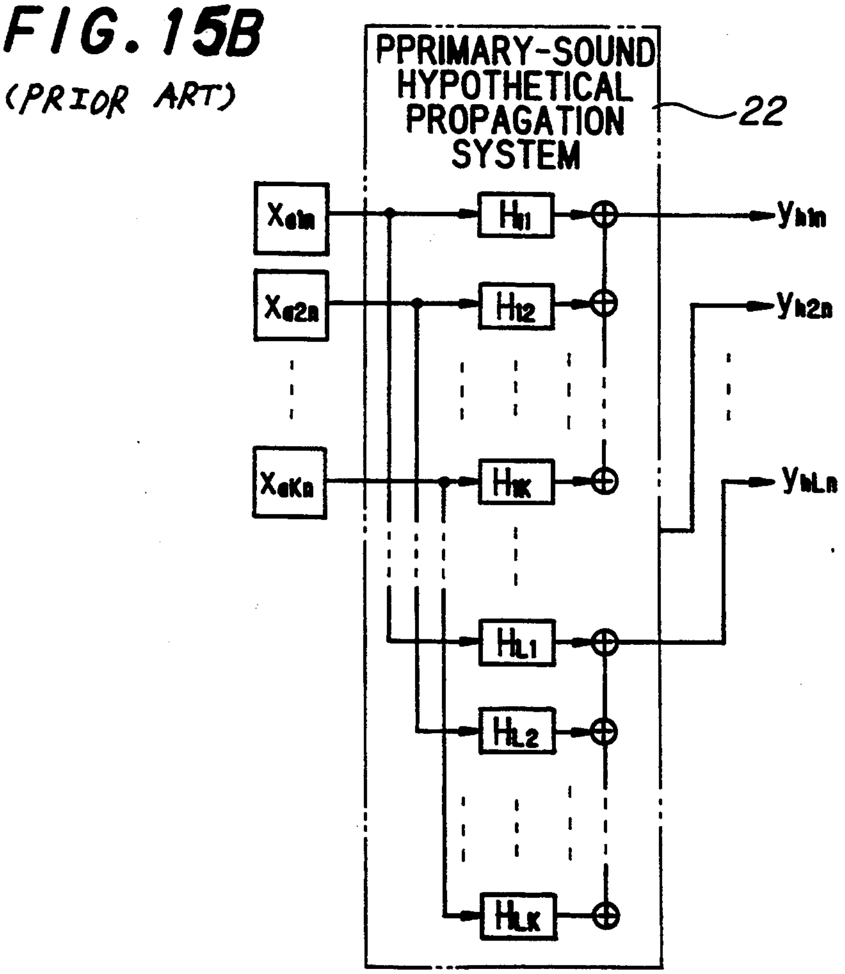
FIG. 15B (PRIOR ART)
Figure 16:
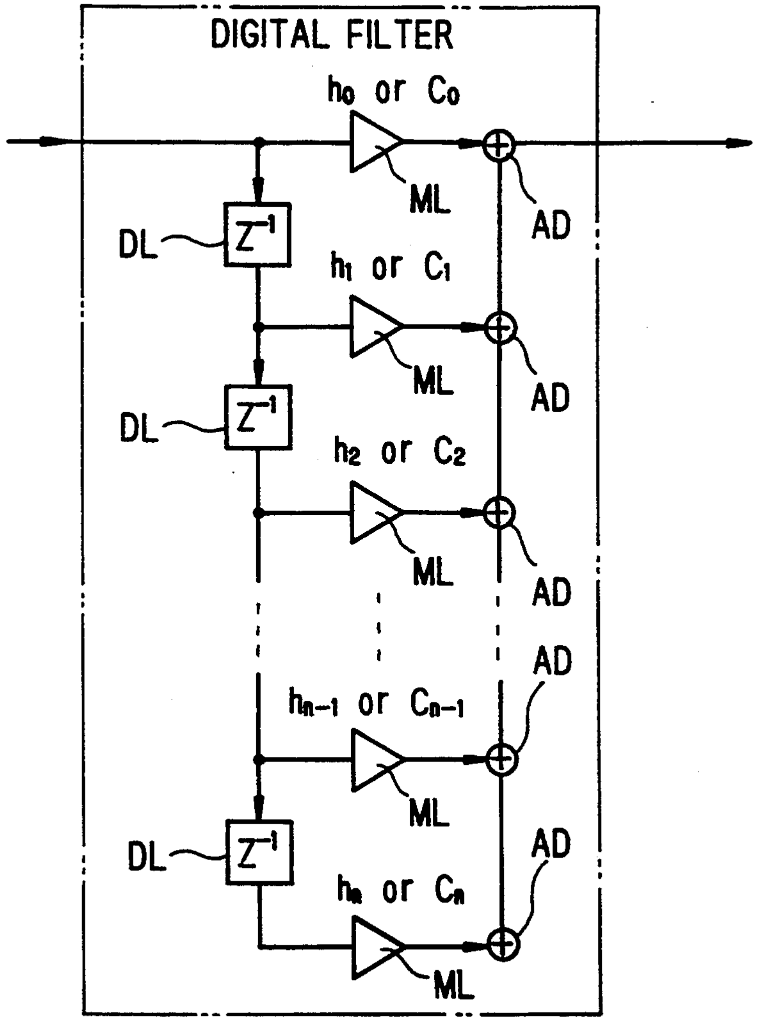
FIG. 16 (PRIOR ART)
FIG. 16 shows the structure of a digital filter which realizes each element of a transfer-function matrix.
Figure 17A:
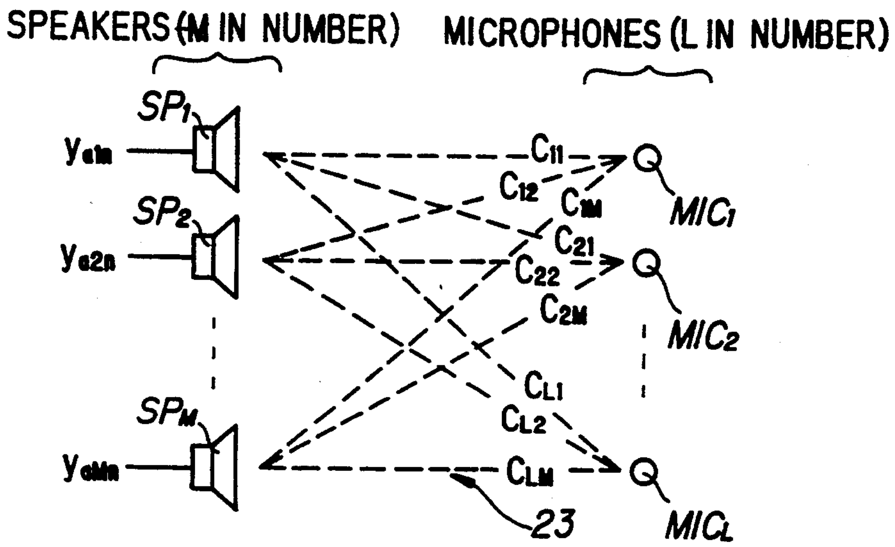
FIG. 17A (PRIOR ART)
FIG. 17A is an explanatory view of a secondary-noise hypothetical propagation system and FIG. 17B shows an example of a realized secondary-noise hypothetical propagation system.
Figure 17B:
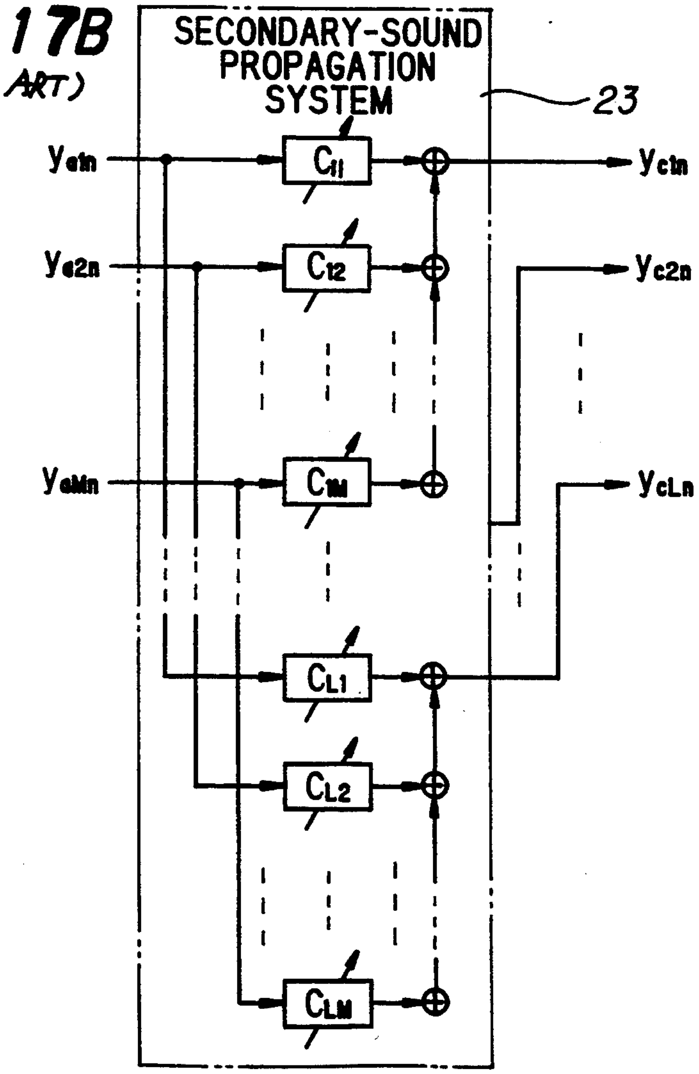
FIG. 17B (PRIOR ART)

FIG. 11 shows another structure of the fourth embodiment of the present invention. In FIG. 11, the same reference numerals are provided for the same elements as those shown in FIG. 9. This structure is different from that of the embodiment shown in FIG. 9 in the following points:

(1) The reference signal generator 33 outputs a reference signal $x_n$ in the form of a composite of the reference signals of the harmonics (the reference signals of the second and fourth harmonics, or the reference signals of the second and sixth harmonics) designated by the harmonic designator 61 or the harmonic selection switch 62, and (2) Only one noise-canceling processor (noise-canceling controller) is provided, and it cancels the second harmonic component and the other harmonic components by an adaptive signal processing based on the error signal $e_n$ and the reference signal $x_n$.

When the engine 31 rotates, its rotational speed R is detected by the rotational speed sensor 32 and input to the reference signal generator 33 and the harmonic designator 61. The harmonic designator 61 decides the harmonic to be canceled on the basis of the engine rotational speed, and inputs the ordinals of the designated harmonics to the reference signal generator 33. The reference signal generation 33 inputs the composite reference signal $x_n$ of the reference signals of a second harmonic and a fourth harmonic (or a second harmonic and a sixth harmonic) to the noise-canceling controller 34.

The error microphone 38 detects the composite sound of the noise at the noise-canceling point and the noise-canceling sound as the error signal $e_n$, and inputs the error signal $e_n$ to the adaptive signal processor 34*a* of the noise-canceling controller 34 through the AD converter 41. At the same time, the composite reference signal $x_n$ of the reference signals of a second harmonic and a fourth harmonic (or a second harmonic and a sixth harmonic) is input to the filtered-X signal producing filter 34*c*, and the noise-canceling controller 34 superimposes the propagation characteristic of the cancel-sound propagation system on the composite reference signal $x_{2n}$ input, produces the reference signal $r_n$ for an adaptive signal processing, and inputs it to the adaptive signal processor 34*a*.

The adaptive signal processor 34a decides the coefficient of the adaptive filter 34b by the adaptive signal processing based on the error signal $e_n$, the reference signal $r_n$ for an adaptive signal processing which is output from the filter 34c and the step-size parameter $\mu$ in accordance with the equation (1). The adaptive filter 34b subjects the composite reference signal $x_n$ to a digital filtering processing in accordance with the coefficient decided by the adaptive signal processor 34a and outputs an analog noise-canceling signal $N_c$ to the DA converter 35. The DA converter 35 converts the noise-canceling signal $N_c$ into an analog noise-canceling signal and inputs it into the speaker 37 through the power amplifier 36. In this way, the speaker 37 emits the noise-canceling sound $S_c$ so that the noise-canceling sound $S_c$ reaches the noise-canceling point through a secondary-sound propagation system 42 and cancels the engine noise.

This cycle of noise-canceling processing is repeated and the noise is canceled quickly. When the engine rotational speed changes, the harmonic designator 61 inputs the ordinal of the harmonic to be cancelled to the reference signal generator 33 in accordance with the engine rotational speed. The reference signal generator 33 inputs the composite reference signal $x_n$ of the designated harmonics into the noise-canceling controller 34 and cancels the noise.

When the harmonics to be canceled are designated by the harmonic selection switch 62, the reference signal generator 33 inputs the composite reference signal $x_n$ generated from the reference signals of the designated harmonics into the noise-canceling controller 34 and cancels the noise.

It is also possible to change the transition control from the fourth harmonic to the sixth harmonic or from the sixth harmonic to the fourth harmonic in accordance with a change in the engine rotational speed, thereby alleviating the feeling of disorder. For example, when the change in the engine rotational speed is slow, the coefficient of the filter and the step-size parameter are gradually increased, so that the generation of the noise-canceling sound is smooth free from the feeling of disorder.

Since the harmonic component dominant in the engine noise is generally influenced not only by the engine rotational speed but also the load of the engine, still another structure may be adopted in which the harmonic to be cancelled is selected in accordance with the engine rotational speed and the inlet pressure (a map is produced in advance on the basis of the respective parameters).

As described above, according to the fourth embodiment, the second harmonic component of the highest level is constantly canceled and another harmonic component to be canceled is selectively designated in accordance with the engine rotational speed, it is possible to reduce the number of harmonic components which are to be canceled and, hence, the number of noise-canceling controllers. It is also possible to cancel the engine noise with a good followability by one noise-canceling controller.

In addition, even if the combinations of the harmonic components of the engine noise which are to be silenced are different depending on the type of automotive vehicle or the auditory sensation of the passenger, it is possible to effectively cancel the engine noise by freely switching and designating the combinations of the harmonic components of the engine noise which are to be silenced by a switch or the like.

As many apparently widely different embodiments of the present invention can be made without departing from the spirit and scope thereof, it is to be understood that the invention is not limited to the specific embodiments thereof except as defined in the appended claims.

What is claimed is:

1. A noise-canceling method for a noise-canceling apparatus having a speaker for outputting a noise-canceling sound in order to cancel engine noise of an engine at a noise-canceling point, a sensor for detecting the composite sound of the noise at said noise-canceling point and said noise-canceling sound, a reference signal generator for generating reference signals corresponding to said engine noise generated from the engine, and a noise-canceling controller for generating a composite noise-canceling signal by an adaptive signal processing based on a composite-sound signal at said noise-canceling point and said reference signal and inputting said composite noise-canceling signal to a speaker, said method comprising the steps of:

a) generating a plurality of reference signals, each of said reference signals corresponding to one of the second, fourth and sixth harmonic components of the engine rotational speed which are contained in said engine noise, the second, fourth and sixth harmonic components having respective noise levels wherein the respective noise level of the second harmonic component is higher than the respective noise levels of the fourth and sixth harmonic components;

b) generating a noise-canceling signal for each of the second, fourth and sixth harmonic components, respectively, for canceling each of the second, fourth and sixth harmonic components of the engine noise, respectively, by executing said adaptive signal processing by using each of said corresponding reference signals and said composite-sound signal;

c) multiplying the reference signals corresponding to the fourth and sixth harmonic components of a low noise level by respective constants to obtain respective products;

d) inputting the composite noise-canceling signal of the noise-canceling signals of the second, fourth and sixth harmonic components, together with the respective products obtained by the multiplication, to the speaker; and e) outputting the noise-canceling sound from the speaker by using the composite noise-canceling signal and the respective products so that the noise levels of the harmonic components become approximately equivalent to one another at the noise-canceling point, thereby equivalently canceling each of said plurality of harmonic components.

2. A noise-canceling method for a noise-canceling apparatus having a noise-canceling sound generating source for generating said noise-canceling sound in order to cancel engine noise of an engine at a noise-canceling point, a sensor for detecting the composite sound of the noise at said noise-canceling point and said noise-canceling sound, a reference signal generator for generating reference signals corresponding to said engine noise generated from an engine, and a noise-canceling controller which has a respective adaptive filter and which determines a corresponding coefficient of said adaptive filter from a predetermined coefficient updating equation by using said composite-sound signal, a respective one of said reference signals and a step-size parameter, input said respective one of said reference signals to said adaptive filter so as to generate a composite noise-canceling signal and inputs said composite noise-canceling signal to said noise-canceling sound generating source, said method comprising the steps of:

a) providing a plurality of noise-canceling controllers in correspondence with second, fourth and sixth harmonic components of the engine rotational speed contained in said engine noise, the second, fourth and sixth harmonic components having respective noise levels wherein the noise level of the second harmonic component is higher than the respective noise levels of the fourth and sixth harmonic components;

b) executing an adaptive signal processing of the second harmonic component having the highest noise level, by a first noise-canceling controller corresponding thereto in accordance with a first coefficient updating equation which does not incorporate an output limiting term, the output limiting term functioning so that first coefficient of said respective adaptive filter is determined in inverse proportion to the output signal of said respective adaptive filter of the first noise-canceling controller;

c) executing the adaptive signal processing of the fourth and sixth harmonic components by second and third noise-canceling controllers corresponding thereto in accordance with a second coefficient updating equation which incorporates an output limiting term, the output limiting term functioning so that a second coefficient of said respective adaptive filter is determined in inverse proportion to the output signal of said respective adaptive filter of each of the second and third noise-canceling controllers;

d) generating said noise-canceling signal by adding the output signals output from said plurality of noise-canceling controllers.

3. A noise-canceling method for a noise-canceling apparatus having a noise-canceling sound generating source for outputting the noise-canceling sound in order to cancel engine noise generated by an engine at a noise-canceling point, a sensor for detecting a composite sound of the noise at said noise-canceling point and for detecting the noise-canceling sound, a reference signal generator for generating reference signals corresponding to said engine noise, and a noise-canceling controller for generating a noise-canceling signal on the basis of a composite-sound signal at said noise-canceling point and said reference signals and inputting said noise-canceling signal to said noise-canceling sound generating source, said method comprising the steps of:

a) generating a plurality of reference signals in correspondence with second, fourth and sixth harmonic components of an engine rotational speed which are contained in said engine noise wherein each of the plurality of reference signals has a corresponding amplitude and the second, fourth and sixth harmonic components have respective noise levels, wherein the noise level of the second harmonic component is higher than the respective noise levels of the fourth and sixth harmonic components;

b) controlling the amplitudes of said reference signals so that the lower the noise level of the harmonic component is, the larger the amplitude of the reference signal corresponding to said harmonic component becomes;

c) executing an adaptive signal processing by using each of said reference signals whose amplitudes are controlled, and said composite-sound signal to obtain the noise-canceling signal; and d) canceling said engine noise at said noise-canceling point by inputting said noise-canceling signal obtained by said adaptive signal processing, to said noise-canceling sound generating source.

4. A noise-canceling method according to claim 3, further comprising the steps of:

e) providing a common noise-canceling controller for all of said harmonic components;

f) generating a composite reference signal from said reference signals whose amplitudes are controlled;

g) inputting said composite reference signal and said composite-sound signal into said common noise-canceling controller; and h) generating said noise-canceling signal using said common noise-canceling controller based on said composite reference signal and said composite-sound signal.

5. A noise-canceling method according to claim 13, further comprising the step of:

e) controlling the noise levels of said reference signals in accordance with said engine rotational speed.

6. A noise-canceling method according to claim 13, further comprising the steps of:

e) providing respective variable-gain amplifiers for receiving said reference signals, respectively, each variable-gain amplifier having a respective gain;

f) providing a table containing a relationship between said engine rotational speed and the respective gains of each of said variable-gain amplifiers;

g) obtaining the respective gains of each of said variable-gain amplifiers in correspondence with said engine rotational speed, from said table;

h) controlling the respective gains of each of said variable-gain amplifiers so as to correspond in a preselected manner with the gain obtained; and i) outputting said reference signals whose amplitudes are controlled from the respective variable-gain amplifiers.

* * * * *

UNITED STATES PATENT AND TRADEMARK OFFICE
CERTIFICATE OF CORRECTION

PATENT NO. : 5,410,606
DATED : April 25, 1995
INVENTOR(S) : Kenji IMAI, et al.

It is certified that error appears in the above-indentified patent and that said Letters Patent is hereby corrected as shown below:

On the title page: item [73] after "Assignee:
insert
--Alpine Electronics Inc.
Tokyo, Japan--.
Column 3, line 43, change --$24_2$, should read --$24_2$'--.
Column 5, line 61, change "," to --'--.
Column 6, line 9, change "," (both occurrences) to --'--.

Signed and Sealed this
Twenty-eighth Day of May, 1996

Attest:

BRUCE LEHMAN

Attesting Officer
Commissioner of Patents and Trademarks